US012751268B2

(12) United States Patent
Chen et al.

(10) Patent No.: US 12,751,268 B2

(45) Date of Patent: Sep. 29, 2026

(54) DEVICE HAVING CFET WITH POWER GRID RAILS IN SECOND METALLIZATION LAYER AND METHOD OF MANUFACTURING SAME

(71) Applicant: TAIWAN SEMICONDUCTOR MANUFACTURING COMPANY, LTD., Hsinchu (TW)

(72) Inventors: Kuan Yu Chen, Hsinchu (TW); Chun-Yen Lin, Hsinchu (TW); Wei-Cheng Tzeng, Hsinchu (TW); Wei-Cheng Lin, Hsinchu (TW); Shih-Wei Peng, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 346 days.

(21) Appl. No.: 18/465,686

(22) Filed: Sep. 12, 2023

(65) Prior Publication Data

US 2024/0304521 A1 Sep. 12, 2024

Related U.S. Application Data

(60) Provisional application No. 63/489,079, filed on Mar. 8, 2023.

(51) Int. Cl.

*H10W 20/20* (2026.01)

*H10D 84/01* (2026.01)

(Continued)

(52) U.S. Cl.

CPC .......... *H10W 20/20* (2026.01); *H10D 84/017* (2025.01); *H10D 84/0186* (2025.01); *H10D 84/038* (2025.01); *H10D 84/85* (2025.01)

(58) Field of Classification Search

CPC . H01L 23/481; H01L 23/5286; H10D 84/017; H10D 84/0186; H10D 84/038; H10D 84/85; H10W 20/20; H10W 20/427

See application file for complete search history.

(56) References Cited

U.S. PATENT DOCUMENTS

| | | | | |
|---|---|---|---|---|
| 2018/0019207 | A1* | 1/2018 | Peng | H01L 23/528 |
| 2021/0233834 | A1* | 7/2021 | Chen | H01L 21/743 |
| 2021/0408011 | A1 | 12/2021 | Fujiwara et al. | |

FOREIGN PATENT DOCUMENTS

| | | |
|---|---|---|
| CN | 109314110 | 2/2019 |
| TW | 202245214 | 11/2022 |

(Continued)

*Primary Examiner* — Herve-Louis Y Assouman

(74) *Attorney, Agent, or Firm* — Hauptman Ham, LLP

(57) ABSTRACT

A device includes: an active region extending in a first direction; a first metal-to-S/D (MD) contact structure extending in a perpendicular second direction, and over and coupled to the active region; a first layer of metallization over the first MD contact structure and having M_1st segments extending in the first direction and each having a substantially same width relative to the second direction, the M_1st segments including M_1st routing segments, and an M_1st power grid (PG) segment having a portion over and coupled to the first MD contact structure; a second layer of metallization over the first layer of metallization and having M_2nd segments that extend in the second direction and include an M_2nd PG rail configured for a first reference voltage, a portion thereof being over and coupled to the M_1st PG segment. the M_2nd PG rail extending across multiple cell regions.

20 Claims, 15 Drawing Sheets

(51) Int. Cl.

| | |
|---|---|
| ***H10D 84/03*** | (2025.01) |
| ***H10D 84/85*** | (2025.01) |
| ***H10W 20/41*** | (2026.01) |

(56) References Cited

FOREIGN PATENT DOCUMENTS

| | | |
|---|---|---|
| TW | 202310301 | 3/2023 |
| TW | 202310541 | 3/2023 |

* cited by examiner

DEVICE HAVING CFET WITH POWER GRID RAILS IN SECOND METALLIZATION LAYER AND METHOD OF MANUFACTURING SAME

PRIORITY

The present application claims the priority of U.S. Provisional Application No. 63/489,079, filed Mar. 8, 2023, which is incorporated herein by reference in its entirety.

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1A:
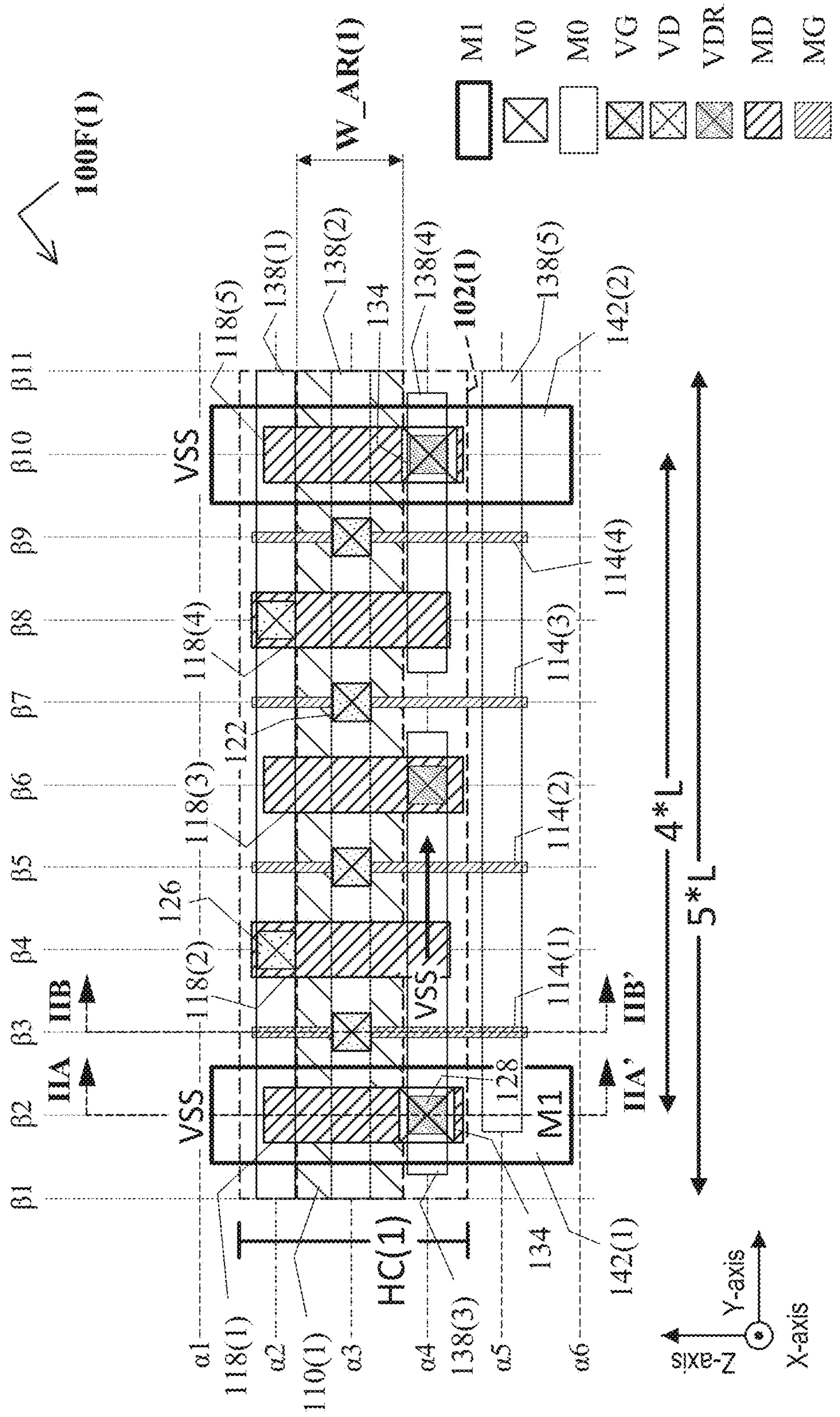
FIGS. 1A-1D are corresponding layout diagrams of corresponding devices, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a cell region has a complementary field-effect transistor (CFET) architecture which includes a power grid (PG) architecture that locates the power rails in the second layers of metallization (layers MET1 and BMET1) and uses intra-cell PG segments in the first layers of metallization (MET0 and BMET0). Layer MET0 includes segments referred to as metal zero (M0) segments. The M0 segments include M0 routing segments and an M0 PG segment. In some embodiments, the M0 routing segments and the M0 PG segment have a same first width. Buried layer BMET0 includes segments referred to as buried metal zero (BM0) segments. The BM0 segments include BM0 routing segments and a BM0 PG segment. In some embodiments, the BM0 routing segments and the BM0 PG segment have a same second width. In some embodiments, the first width is the same as the second width. Layer MET1 includes an M1 PG rail. Layer BMET1 includes a BM1 PG rail.

According to another approach for a CFET architecture, the PG architecture thereof locates power rails in layers MET0 and BMET0, and uses widths of the M0 and BM0 power rails that are larger than corresponding widths of M0 and BM0 routing segments, i.e., uses non-uniform widths of segments in layers MET0 and BMET0. The larger widths of the M0 and BM0 power rails reduces the space available in layers MET0 and BMET0 for the M0 and BM0 routing segments, i.e., reduces the number of the M0 and BM0 routing segments that are available, and thereby reduces routability. By contrast, an advantage of a PG architecture which locates power rails in layers MET1 and BMET1 (according to at least some of the present embodiments) is that the intra-cell M0 and BM0 PG segments can be the same width correspondingly as the M0 and BM0 routing segments, i.e., all segments in layers M0 and BM0 can be made the same corresponding widths. Having all segments in layers MET0 and BMET0 be the same corresponding width beneficially increases the space available in layers MET0 and BMET0 for the M0 and BM0 routing segments, i.e., increases the number of the M0 and BM0 routing segments that are available, and thereby increases routability.

Figure 1B:
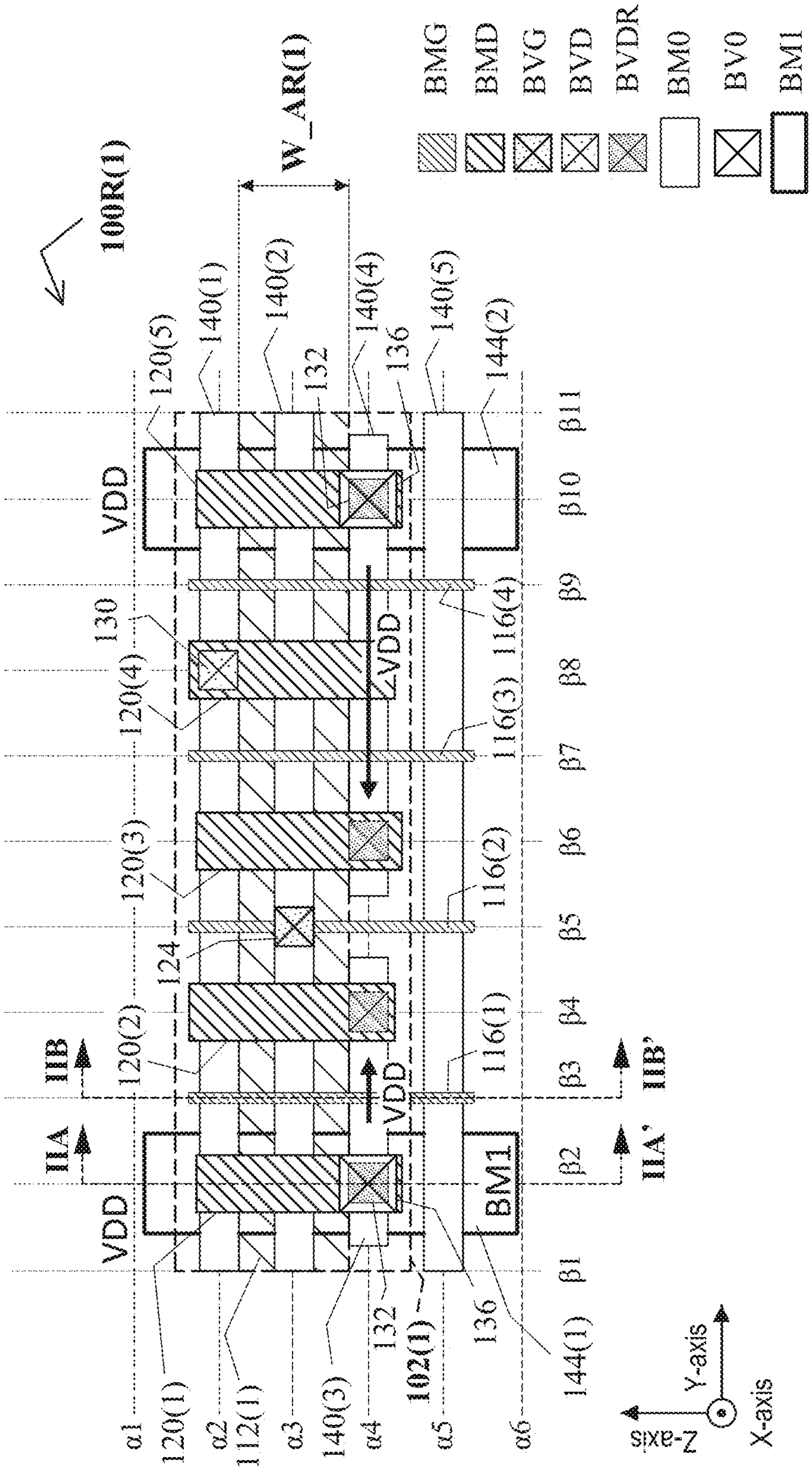

FIGS. 1A-1B are layout diagrams of corresponding front 100F(1) and back 100R(1) sides of a device that includes a cell region 102(1), in accordance with some embodiments.

The layout diagrams of FIGS. 1A-1B are representative of a semiconductor device. Structures in the semiconductor device are represented by patterns (also known as shapes) in the layout diagram. For simplicity of discussion, elements in the layout diagram of FIGS. 1A-1B (and also in other layout diagrams disclosed herein) will be referred to as if they are structures rather than patterns per se. For example, pattern 138(1) in FIG. 1A represents an M0 segment. In the following discussion, element 138(1) is referred to as M0 segment 138(1) rather than as M0 pattern 138(1).

In FIGS. 1A-1B, as well as in other layout diagrams disclosed herein, an orthogonal Cartesian coordinate system is assumed in which a first direction is parallel to the X-axis, a second direction is parallel to the Y-axis and a third direction is parallel to the Z-axis. A layout diagram per se is a top view. Shapes in the layout diagram are two-dimensional relative to, e.g., the X-axis and the Y-axis, whereas the device being represented is three-dimensional. Relative to the Z-axis, front side 100F(1) is stacked on back side 100R(1).

Typically, relative to the Z-axis, the device is organized as a stack of layers in which are located corresponding structures, i.e., to which belong corresponding structures. Each shape in the layout diagram represents, more particularly, a component in a corresponding layer of the corresponding device. Also, typically, the layout diagram represents relative depth, i.e., positions along the Z-axis, of shapes and corresponding layers by superimposing a second shape on a first shape so that the second shape at least partially overlaps the first shape. Regarding some structures which are stacked in a layout diagram along the Z-axis, however, the stacking order along the Z-axis is distorted in some respects relative to the corresponding device, this being done in the layout diagram, e.g., FIG. 2A, for simplicity of illustration. For example, VG contact structures 122, VD contact structures 126 and VDR contact structures 128 are shown as being superimposed on corresponding M0 segments 138(1)-138(4) rather than underneath the same, for simplicity of illustration.

Being layout diagrams, each of FIGS. 1A-1B are organized according to the following: a first grid that includes reference lines (alpha tracks) α1-α6 that extend parallel to the X-axis; and a second grid that includes beta reference lines (beta tracks) β1-β11 that extend parallel to the Y-axis.

Relative to the X-axis, the beta tracks have a pitch Pp. In FIGS. 1A-1B, pitch Pβ is one half of L such that Pβ=½%*L, where L represents a uniform distance for the corresponding semiconductor process technology node. A value for L is determined by the design rules and scale of the corresponding semiconductor process technology node. In some embodiments, the uniform distance L represents one contacted poly pitch (CPP) for the corresponding semiconductor process technology node. Here, the word 'poly' in the term CPP does not necessarily imply that the gate structures in semiconductor devices based correspondingly on FIGS. 1A-1B are to be formed of polysilicon but instead represents a historical convenience, i.e., because gate structures in ICs manufactured according to a predecessor semiconductor process technology node often were formed of polysilicon.

Relative to the Y-axis, the alpha tracks have a pitch Pα. In FIGS. 1A-1B, pitch Pα is the same as a pitch PM0 of the M0 segments (discussed below) such that Pα=PM0. A value for PM0 is determined by the design rules and scale of the corresponding semiconductor process technology node. In FIGS. 1A-1B, a pitch PBM0 of the BM0 segments (discussed below) is that same as pitch Pα such that Pα=PBM0=PM0. In some embodiments, PBM0≠PM0.

Figures 2A, 2B, 2C:
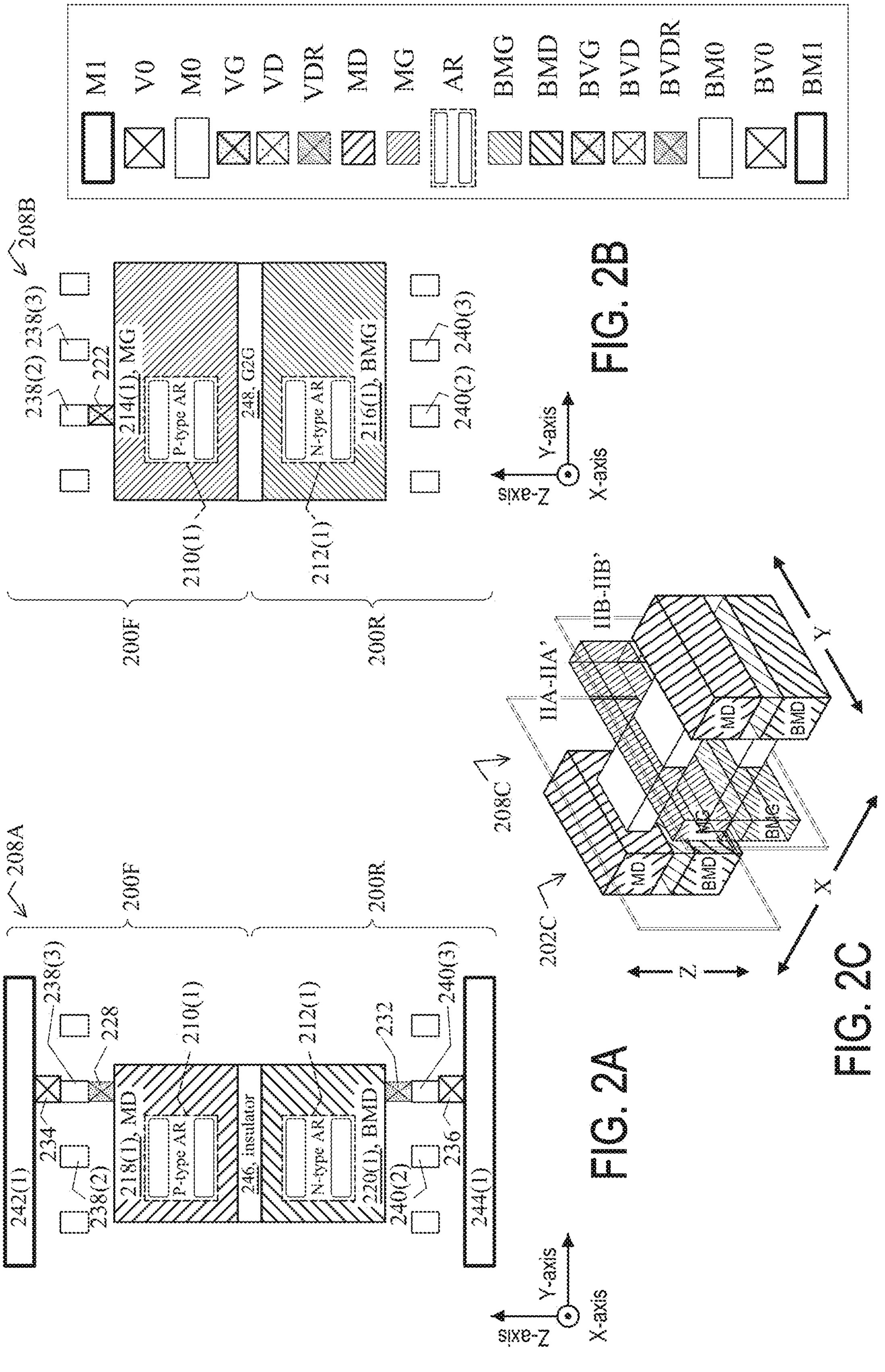
FIGS. 2A-2B are corresponding cross-sectional views of a CFET stack, in accordance with some embodiments.
FIG. 2C is a three-quarter perspective view of a CFET stack, in accordance with some embodiments.

Each of FIGS. 1A-1B includes: a section line IIA-IIA' that extends parallel to the Y-axis, is collinear with beta track β2, and corresponds to a cross-section 208A of FIG. 2A; and a section line IIB-IIB' that extends parallel to the Y-axis, is collinear with beta track β3, and corresponds to a cross-section 208B of FIG. 2B.

With front side 100F(1) stacked on back side 100R(1) relative to the Z-axis, front side 100F(1) and back 100R(1) sides together represent a complementary field-effect transistor (CFET) architecture. The stack of an active region (AR) 110(1) of front side 100F(1) on an AR 112(1) of back side 100R(1) represents a CFET stack (208C FIG. 2C).

ARs 110(1) and 112(1) extend parallel to the X-axis and have corresponding and different first and second dopant types. FIGS. 1A-1B assume that the first dopant type is a P-type dopant used for positive-channel metal-oxide semiconductor (PMOS) transistor technologies and that the second dopant is an N-type dopant used for negative-channel metal-oxide semiconductor (NMOS) transistor technologies such that AR 110(1) and AR 112(1) are correspondingly referred to as ARP 110(1) and ARN 112(1). In some embodiments, the first dopant is an N-type dopant and the second dopant is a P-type dopant.

Front side 100F(1) includes a first layer of metallization and back side 100R(1) of FIG. 1B includes a first buried layer of metallization. In FIGS. 1A-1B, and more generally for the present disclosure, a numbering convention is assumed in which the first layer is layer zero, i.e., the first layer of metallization over ARP 110(1) is referred to as layer MET0, a first layer of interconnection over layer MET0 is referred to as layer VIA0, the first layer of metallization under ARN 112(1) is referred to as layer BMET0, and a first layer of interconnection under layer BMET0 is referred to as layer BVIA0. In some embodiments, depending upon the numbering convention of the corresponding process node by which a semiconductor device is manufactured, the first layer is layer one, i.e., the first layer of metallization layer is MET1, the first layer of interconnection over layer MET1 is referred to as layer VIA1, the first layer of metallization under ARN 112(1) is referred to as layer BMET1, and the first layer of interconnection under layer BMET0 is referred to as layer BVIA1.

Layer MET0 includes M0 segments 138(1)-138(5) that extend parallel to the X-axis and are collinear correspondingly with alpha tracks α2-α5. M0 segments 138(1)-138(2) and 138(5) are configured for conducting corresponding routing signals (e.g., input/output (I/O) signals, control signals, or the like). Each of M0 segments 138(3) and 138(4) is a power grid (PG) segment that is configured for conducting a first reference voltage, e.g., VSS. Relative to the Y-axis, each of M0 segments 138(1)-138(5) has substantially the same width.

Portions of M0 segments 138(1)-138(2) and 138(4) are within cell region 102(1). Substantially an entirety of M0 segment 138(3) is within cell region 102(1); as such M0 segment 138(3) is referred to as an intra-cell segment, and more specifically as an intra-cell PG segment. M0 segment 138(5) is outside of cell region 102(1).

Relative to the Y-axis: M0 segment 138(2) is overlapped by ARP 110(1); and M0 segments 138(1) and 138(3)-138(5) are substantially free from overlapping ARP 110(1), i.e., are substantially not overlapped by ARP 110(1).

Layer BMET0 includes BM0 segments 140(1)-140(5) that extend parallel to the X-axis and are collinear correspondingly with alpha tracks α2-α5. BM0 segments 140(1)-140(2) and 140(5) are configured for conducting corresponding routing signals. Each of BM0 segments 140(3) and 140(4) is a PG segment that is configured for conducting a second reference voltage, e.g., VDD. Relative to the Y-axis, each of BM0 segments 140(1)-140(5) has substantially the same width.

Portions of BM0 segments 140(1)-140(3) are within cell region 102(1). Substantially an entirety of BM0 segment

140(4) is within cell region 102(1); as such, BM0 segment 140(4) is referred to as an intra-cell segment, and more specifically as an intra-cell PG segment. BM0 segment 140(5) is outside of cell region 102(1).

Relative to the X-axis, cell region 102(1) has a length of 4*L. In some embodiments, cell region 102(1) has a length other than 4*L.

Relative to the Y-axis, cell region 102(1) has a width (or height) of HC(1) and each of ARP 110(1) and ARN 112(1) has a width (or height) of W_AR(1). HC(1) is based on W_AR(1), a number of alpha tracks included in cell region 102(1) plus gaps (gap_AR FIG. 4) between the uppermost and lowermost M0 and/or BM0 segments included in cell region 102(1), relative to the Y-axis.

Relative to the Y-axis: BM0 segment 140(2) is overlapped by ARN 112(1); and BM0 segments 140(1) and 140(3)-140(5) are substantially free from overlapping ARN 112(1), i.e, are substantially not overlapped by ARN 112(1).

Front side 100F(1) of FIG. 1A further includes: metal-to-gate (MG) contact structures 114(1)-114(4) extending parallel to the Y-axis, extending around (FIG. 2B) and being coupled to corresponding portions of ARP 110(1); and, in a context of source/drain (S/D) regions of ARP 110(1), metal-to-S/D (MD) contact structures 118(1)-118(5) extending parallel to the Y-axis, extending around (FIG. 2A) and being coupled to corresponding portions of ARP 110(1).

Back side 100R(1) of FIG. 1B further includes: buried MG (BMG) contact structures 116(1)-116(4) extending parallel to the Y-axis, extending around (FIG. 2B) and being coupled to corresponding portions of ARN 112(1); and, in a context of S/D regions of ARN 112(1), buried MD (BMD) contact structures 120(1)-120(5) extending parallel to the Y-axis, extending around (FIG. 2A) and being coupled to corresponding portions of ARN 112(1).

Front side 100F(1) of FIG. 1A further includes: instances of a via-to-MG (VG) contact structure 122 correspondingly between and thereby coupling MG contact structures 114(1)-114(4) and portions of M0 segment 138(2); instances of a via-to-MD (VD) contact structure 126 correspondingly between and thereby coupling MD contact structures 118(2) and 118(4) and portions of M0 segments 138(1); and instances of a via-to-VD-for-PR (VDR) contact structure 128 correspondingly between and thereby coupling MD contact structures 118(1), 118(3) and 118(5) and portions of M0 segments 138(3) and 138(4).

Back side 100R(1) of FIG. 1B further includes: an instance of a via-to-BMG (BVG) contact structure 124 between and thereby coupling BMG contact structure 116(2) and a portion of BM0 segment 140(2); an instance of a via-to-BMD (BVD) contact structure 130 between and thereby coupling BMD contact structure 120(4) and a portion of BM0 segment 140(1); and instances of a via-to-BVD-for-PG (BVDR) contact structure 132 correspondingly between and thereby coupling BMD contact structures 120(1)-120(3) and 120(5) and portions of BM0 segments 140(3) and 140(4).

Front side 100F(1) of FIG. 1A further includes a second layer of metallization MET1 (layer MET1) over layer MET0. Layer MET1 includes M1 segments (some of which are not shown) that extend parallel to the Y-axis, and are collinear correspondingly with one or more of beta tracks β1-β11. The M1 segments include M1 segments 142(1) and 142(2) that are collinear correspondingly with beta tracks β2 and β10, and are PG segments configured for conducting VSS. Relative to the Y-axis, each of M1 PG rails 142(1)-142(2) extends beyond cell region 102(1) into one or more other cell regions (not shown). As such, each of M1 PG rails 142(1)-142(2) is an example of a power rail within a PG architecture and accordingly are referred to hereafter as M1 PG rails 142(1)-142(2). Relative to the X-axis, M1 PG rails (e.g., 142(1)-142(2)) have a pitch PPGM1(1). In FIG. 1A, PPGM1(1)=4*L. In some embodiments, PPGM1(1) has a value other than 4*L. A value for PPGM1(1) is determined by the design rules and scale of the corresponding semiconductor process technology node.

In some embodiments, other ones of the M1 segments (not shown) are configured for conducting corresponding routing signals (M1 routing segments). In some embodiments, relative to the X-axis, the M1 routing segments (not shown) have a width that is narrower than a width of each of M1 PG rails 142(1) and 142(2). A typical power rail is wider than a typical routing segment because many more couplings (or taps) are made to the power rail and/or because the power rail is substantially longer as compared to the routing segment such that the power rail conducts greater current than the routing segment.

In some embodiments, relative to the X-axis, the M1 routing segments (not shown) have a width that is the same as the width of each of M1 PG rails 142(1)-142(2).

Back side 100R(1) of FIG. 1B further includes a second layer of metallization BMET1 (layer BMET1) under layer BMET0. Layer BMET1 includes BM1 segments (some of which are not shown) that extend parallel to the Y-axis, and are collinear correspondingly with one or more of beta tracks β1-β11. The BM1 segments include BM1 segments 144(1) and 144(2) that are collinear correspondingly with beta tracks β2 and β10, and are PG segments configured for conducting VDD. Relative to the Y-axis, each of BM1 PG rails 144(1)-144(2) extends beyond cell region 102(1) into one or more other cell regions (not shown). As such, each of BM1 PG rails 144(1)-144(2) is an example of a buried power rail within a PG architecture and accordingly are referred to hereafter as BM1 PG rails 144(1)-144(2). Relative to the X-axis, BM1 PG rails (e.g., 144(1)-144(2)) have a pitch PBM1(1). In FIG. 1B, PBM1(1)=4*L. In some embodiments, PBM1(1) has a value other than 4*L. A value for BPPGM1(1) is determined by the design rules and scale of the corresponding semiconductor process technology node.

In some embodiments, other ones of the BM1 segments (not shown) are configured for conducting corresponding routing signals (BM1 routing segments). In some embodiments, relative to the X-axis, BM1 routing segments (not shown) have a width that is narrower than a width of each of BM1 PG rails 144(1) and 144(2). In some embodiments, relative to the X-axis, the BM1 routing segments (not shown) have a width that is the same as the width of each of BM1 PG rails 144(1)-144(2).

In some embodiments, relative to the X-axis, BM1 PG rails 144(1)-144(2) have the same width as M1 PG rails 142(1)-142(2). In some embodiments, relative to the X-axis, the BM1 routing segments (not shown) have the same width as the M1 routing segments (not shown).

Front side 100F(1) of FIG. 1A further includes instances of a via-to-M0 (V0) contact structure 134 correspondingly between M0 PG segments 138(3) and 138(4) and M1 PG rails 142(1) and 142(2). Relative to each of the X-axis and the Y-axis, the instances of V0 contact structure 134 are aligned with corresponding instances of VDR contact structure 128.

Back side 100R(1) of FIG. 1B further includes instances of a via-to-BM0 (BVO) contact structure 136 correspondingly between BM0 PG segments 140(3) and 140(4) and BM1 PG rails 144(1) and 144(2). Relative to each of the X-axis and the Y-axis, the instances of BVO contact structure 136 are aligned with corresponding instances of BVDR contact structure 132.

Cell region 102(1) of FIGS. 1A-1B has a CFET architecture which includes a PG architecture that locates the power rails in the second layers of metallization (layers MET1 and BMET1) and uses intra-cell PG segments in the first layers of metallization (layers MET0 and BMET0). Examples of the power rails in the second levels of metallization include M1 PG rails 142(1)-142(2) in layer MET1 and BM1 PG rails 144(1)-144(2) in BMET1, or the like. Examples of intra-cell PG segments in the first levels of metallization include intra-cell M0 PG segments 138(3)-138(4) in layer MET0 and intra-cell BM0 PG segments 140(3)-140(4) of layer BMET0.

According to another approach for a CFET architecture, the PG architecture thereof locates power rails in layers MET0 and BMET0, and uses widths of the M0 and BM0 power rails that are larger than corresponding widths of M0 and BM0 routing segments, i.e., uses non-uniform widths of segments in layers MET0 and BMET0. The larger widths of the M0 and BM0 power rails reduce the space available in layers MET0 and BMET0 for the M0 and BM0 routing segments, i.e., reduces the number of the M0 and BM0 routing segments that are available, and thereby reduces routability. By contrast, an advantage of a PG architecture which locates power rails in layers MET1 and BMET1 (according to at least some of the present embodiments) is that the intra-cell M0 and BM0 PG segments can be the same width correspondingly as the M0 and BM0 routing segments, i.e., all segments in layers M0 and BM0 can be made the same corresponding widths. Intra-cell M0 and BM0 PG segments can be narrower than a typical power rail, i.e., can be the same width as corresponding M0 and BM0 routing segments, because many fewer couplings (or taps) are made to the M0/BM0 PG segment and/or because the M0/BM0 PG segment power rail is substantially shorter as compared to the power rail such that the M0/BM0 PG segment typically conducts substantially smaller current than the typical power rail. Having all segments in layers MET0 and BMET0 be the same corresponding width beneficially increases the space available in layers MET0 and BMET0 for the M0 and BM0 routing segments, i.e., increases the number of the M0 and BM0 routing segments that are available, and thereby increases routability. A further advantage is that a PG architecture which locates power rails in layers MET1 and BMET1 (according to at least some of the present embodiments) facilitates scaling widths of the ARP and ARN of the CFET stack of corresponding cell regions (FIGS. 4 and 5A-5B), which improves design flexibility.

In some embodiments, an M0 PG segment and/or a BM0 PG segment extends beyond a single cell region (inter-cell M0/BM0 PG segment) but nevertheless many fewer couplings (or taps) are made to the inter-cell M0/BM0 PG segment and/or the inter-cell M0/BM0 PG segment power rail is substantially shorter as compared to a typical power rail such that the inter-cell M0/BM0 PG segment conducts substantially smaller current than the typical power rail. As such, the inter-cell M0/BM0 PG segment is narrower than a typical power rail. In some embodiments, inter-cell M0 or BM0 PG segment is the same width as corresponding M0 and BM0 routing segments.

Relative to the X-axis, left and right sides of cell region 102(1) are collinear with corresponding beta track lines β1 and β11. In some embodiments, cell region 102(1) includes isolation dummy gates (IDGs) that are collinear correspondingly with beta track lines β1 and β11 such that the IDGs represent left and right sides of cell region 102(1).

In some embodiments, an IDG is a dielectric structure that includes one or more dielectric materials and functions as an electrical isolation structure. Accordingly, an IDG is not a structure that is electrically conductive and thus does not function, e.g., as an active gate of a transistor. An IDG includes one or more dielectric materials and functions as an electrical isolation structure. In some embodiments, an IDG is based on an MD contact structure or a BMD contact structure as a precursor. In some embodiments, a method of forming an IDG includes: forming an MD or BMD contact structure; sacrificing/removing (e.g., etching) the MD or BMD contact structure to form a trench around the corresponding ARP or ARN; (optionally) removing a portion or all of the corresponding ARP or ARN that previously had been partially or completely surrounded by MD or BMD contact structure to deepen the trench and thereby partially or completely divide the corresponding ARP or ARN from extending beyond/outside the corresponding left or right side of cell region relative to the X-axis; and then filling the trench with one or more dielectric materials such that the physical dimensions of the resultant electrical isolation structure, i.e., the IDG, are similar to the dimensions of the MD or BMD contact structure which was sacrificed. In some embodiments, an IDG is a dielectric feature that includes one or more dielectric materials (e.g., oxide, nitride, oxynitride, or other suitable materials), and functions as an isolation feature. In some embodiments, an IDG is a type of continuous polysilicon on oxide diffusion (OD) edge structure, and is referred to as a type of CPODE structure.

Figure 1C:
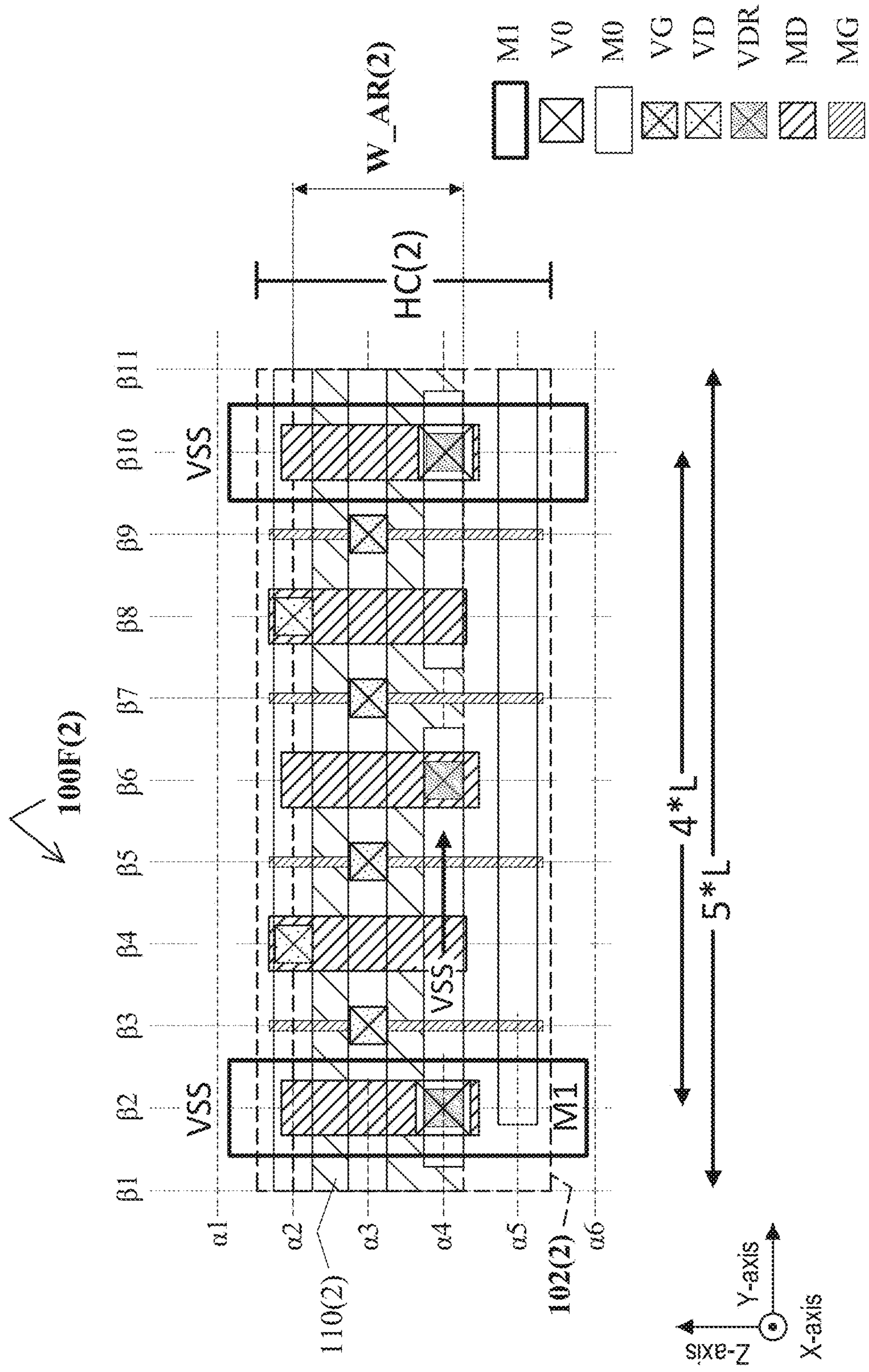
Figure 1D:
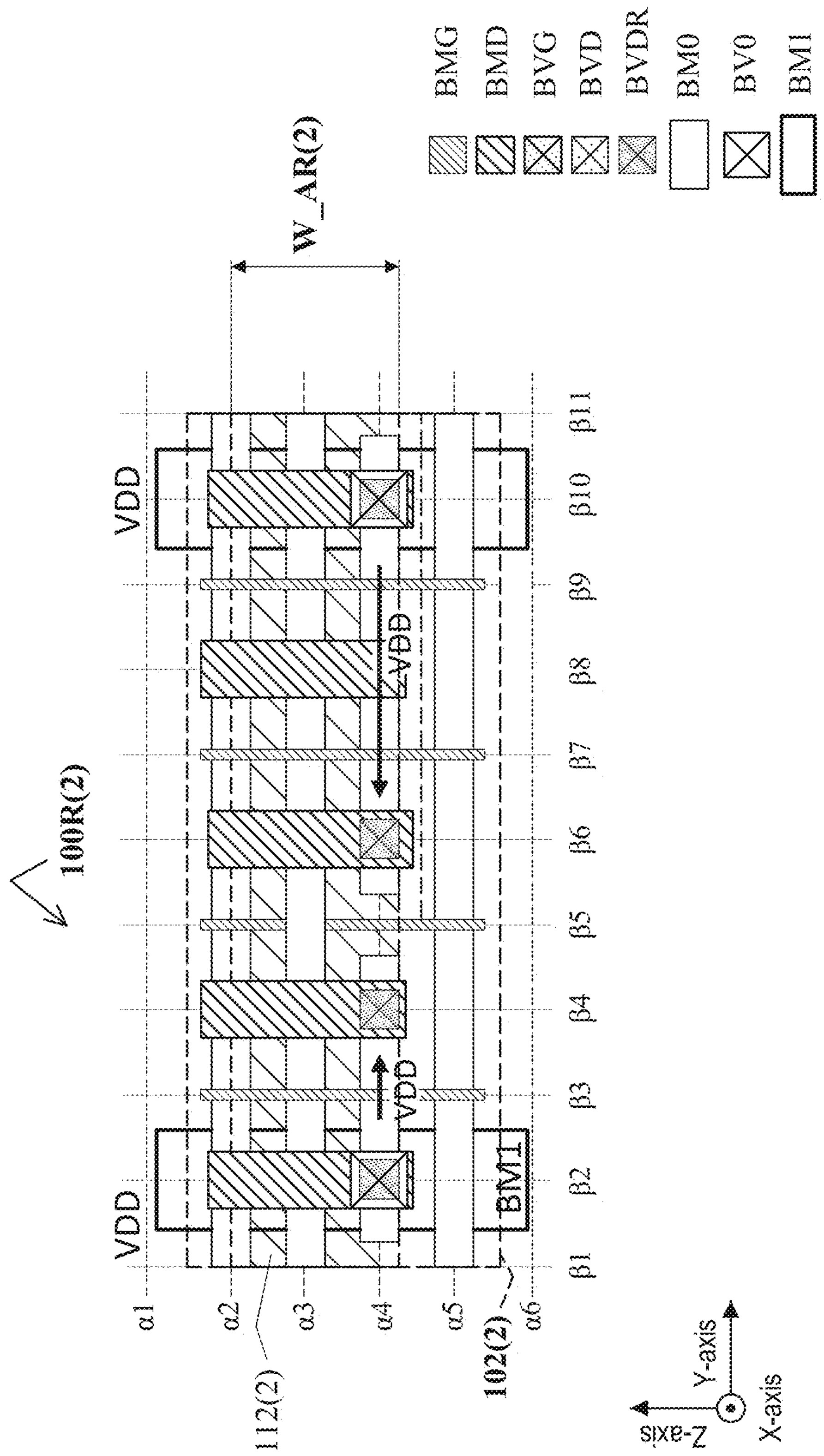

FIGS. 1C-1D are layout diagrams of corresponding front 100F(2) and back 100R(2) sides of a device that includes a cell region 102(2), in accordance with some embodiments.

Cell region 102(2) of FIGS. 1C-1D is similar to cell region 102(1) of FIGS. 1A-1B. For brevity, the discussion will focus on differences of cell region 201(2) as compared to cell region 101(1) rather than on similarities.

Cell region 102(2) includes ARP 110(2) in FIG. 1C and ARN 112(2) in FIG. 1D, whereas cell region 102(1) includes ARP 110(1) in FIG. 1A and ARN 112(1) in FIG. 1B. Relative to the Y-axis, cell region 102(2) has a width (or height) of HC(2) whereas cell region 102(1) has a width (or height) of HC(1), and where HC(1)<HC(2). Also, relative to the Y-axis, each of ARP 110(2) and ARN 112(2) has a width (or height) of W_AR(2) whereas each of ARP 110(1) and ARN 112(1) has a width (or height) of W_AR(1), and where W_AR(1)<W_AR(2). HC(2) is based on W_AR(2), a number of alpha tracks included in cell region 102(1) plus gaps between the uppermost and lowermost M0 and/or BM0 segments included in cell region 102(1), relative to the Y-axis.

FIGS. 2A-2B are corresponding cross-sectional views 208A-208B of a CFET stack, in accordance with some embodiments.

FIG. 2C is a three-quarter perspective view of a CFET stack 208C, in accordance with some embodiments. CFET stack 208C of FIG. 2C is a simplified version of the CFET stack corresponding to cross-sections 208A-208B of FIGS. 2A-2B.

Cross-section 208A of FIG. 2A corresponds to section IIA-IIA' of each of FIGS. 1A-1B and 2C. Cross-section 208B of FIG. 2B corresponds to section IIA-IIA' of each of FIGS. 1A-1B and 2C. In FIGS. 2A-2C, an orthogonal Cartesian coordinate system is assumed in which a first direction is parallel to the X-axis, a second direction is parallel to the Y-axis and a third direction is parallel to the Z-axis.

Cross-sections 208A-208B follow a similar numbering scheme to that of the layout diagrams of FIGS. 1A-1B. Though some components correspond, such components also differ. To help identify components which correspond but nevertheless have differences, the numbering convention uses 2-series numbers for cross-sections 208A-208B while FIGS. 1A-1B use 1-series numbers. For example, MD contact structure 218(1) in FIG. 2A corresponds to MD contact structure 118(1) in FIG. 1A. For brevity, the discussion will focus more on differences between FIGS. 2A-2B and FIGS. 1A-1B than on similarities.

In FIG. 2A, cross-section 208A includes: ARN 210(1); ARP 212(1); MD contact structure 218(1); BMD contact structure 220(1); an instance of VDR 228; an instance of BVDR 232; M0 segments of which M0 segment 238(2) and M0 PG segment 238(3) are called out; BM0 segments of which BM0 segment 240(2) and BM0 PG segment 240(3) are called out; an instance of V0 contact structure 234; an instance of BVO contact structure 236; M1 PG rail 242(1); BM1 PG rail 244(1); and an insulator 246. Relative to the Z-axis, MD contact structure 218(1) is separated from BMD 220(1) by insulator 246, i.e., MD contact structure 218(1) is not coupled to BMD 220(1).

In FIG. 2B, cross-section 208B includes: ARN 210(1); ARP 212(1); MG contact structure 214(1); BMD contact structure 220(1); an instance of VD 222; M0 routing segment 238(2) and M0 PG segment 238(3) are called out; BM0 segments of which BM0 routing segment 240(2) and BM0 PG segment 240(3) are called out; and an MG-to-MG (G2G) contact structure 248. Relative to the Z-axis, MG contact structure 214(1) is coupled to BMG 216(1) by G2G contact structure 248.

Regarding FIG. 2A, in some embodiments (not shown), VDD is provided from back side 200R to front side 200F by replacing insulator 246 with an MD-to-MD (D2D) contact structure (not shown) and removing the instance of VDR 228 which otherwise would couple MD contact structure 218(1) to M0 PG segment 238(3). Accordingly, MD contact structure 218(1) is coupled to BMD contact structure 220(1) albeit without shorting BM1 PG rail 244(1) to M1 PG rail 242(1). In some embodiments, an instance of VDR 228 is added between MD contact structure 218(1) and M0 routing segment 238(2) to distribute VDD along the X-axis. In some embodiments, other arrangements are used to provide VDD from back side 200R to front side 200F, e.g., by using an arrangement of buried LI (BLI) structures in the same layer as the instance of BVDR 232, deep via (DV) structures, local interconnect (LI) structures in the same layer as the instance of VDR 228, or the like.

Regarding FIG. 2A, in some embodiments (not shown), VSS is provided from front side 200F to back side 200R by replacing insulator 246 with a D2D contact structure (not shown) and removing the instance of BVDR 223 which otherwise would couple BMD contact structure 220(1) to BM0 PG segment 240(3). Accordingly, BMD contact structure 220(1) is coupled to MD contact structure 218(1) albeit without shorting M1 PG rail 242(1) to BM1 PG rail 244(1). In some embodiments, an instance of BVDR 232 is added between BMD 220(1) and BM0 routing segment 240(2) to distribute VDD along the X-axis. In some embodiments, other arrangements are used to provide VSS from front side 200F to back side 200R, e.g., by using an arrangement of LI structures, DV structures, BLI structures, or the like.

Figure 3A:
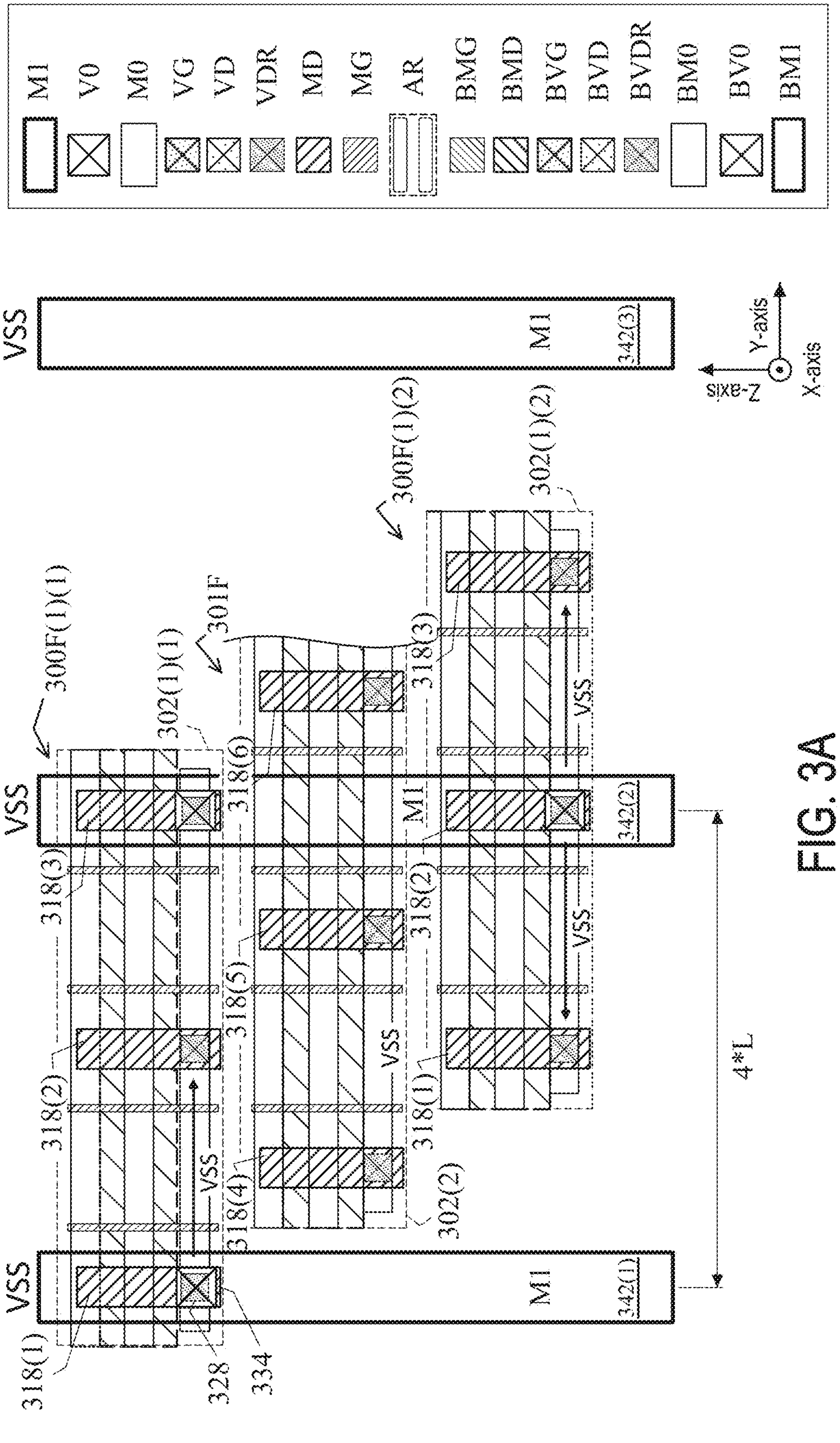
FIGS. 3A-3B, 4 and 5A-5B are corresponding layout diagrams of corresponding cell regions, in accordance with some embodiments.

FIG. 3A is a layout diagram of front sides 300F(1)(1), 301F and 300F(1)(2) of corresponding cell regions 302(1)(1), 302(2) and 302(1)(2), in accordance with some embodiments.

In some embodiments, cell regions 302(1)(1), 302(2) and 302(1)(2) have a CFET architecture and thus have corresponding back sides (not shown for simplicity of illustration).

Relative to the Y-axis, cell regions 302(1)(1), 302(2) and 302(1)(2) are stacked on each other. Relative to the X-axis, cell regions 302(1)(1), 302(2) and 302(1)(2) are displaced (or shifted) relative to each other.

Cell regions 302(1)(1) and 302(1)(2) are instances of the same first cell region. Cell region 302(2) is a second cell region that is different than the first cell region.

Front sides 300F(1)(1), 301F and 300F(1)(2) of FIG. 3A follow a similar numbering scheme to that of the layout diagrams of FIGS. 1A-1B. Though some components correspond, such components also differ. To help identify components which correspond but nevertheless have differences, the numbering convention uses 3-series numbers for front sides 300F(1)(1), 301F and 300F(1)(2) while FIGS. 1A-1B use 1-series numbers. For example, MD contact structure 318(1) in FIG. 3A corresponds to MD contact structure 118(1) in FIG. 1A. For brevity, the discussion will focus more on differences between FIG. 3A and FIGS. 1A-1B than on similarities.

For simplicity of illustration, some but not all elements in FIG. 3A are called out with reference numbers. In FIG. 3A, elements in front side 300F(1)(1) which are called out with reference numbers include: MD contact structures 318(1)-318(3); instances of VDR 328; an instance of V0 contact structure 334; (a portion of) an M1 PG rail 342(1); and (a portion) of an M1 PG rail 342(2). Elements in front side 301F which are called out with reference numbers include MD contact structures 318(4)-318(6); and (a portion) of M1 PG rail 342(2). Elements in front side 300F(1)(2) which are called out with reference numbers include: MD contact structures 318(1)-318(3); and (a portion of) M1 PG rail 342(1).

Front side 301F receives VSS from an M1 PG rail other than M1 PG rails 342(1) or 342(2). FIG. 3A further includes an M1 PG rail 342(3) of which no portion is included in either of front sides 300F(1)(1) or 300F(1)(2). In some embodiments (not shown), front side 301F receives VSS from M1 PG rail 342(3).

In FIG. 3A: MD contact structure 318(2) of cell region 302(1)(1) is substantially free from being overlapped by M1 PG rail 343(2). M1 PG rail 342(2) substantially overlaps MD contact structure 318(3) of cell region 302(1)(1) and MD contact structure 318(2) of cell region 302(1)(2); and MD contact structures 318(4), 318(5) and 318(6) cell region 302(2) and MD contact structures 318(1) and 318(3) of cell region 302(1)(2) are substantially free from being overlapped by M1 PG rail 342(2).

Relative to the X-axis, M1 PG rails 342(1)-342(3) have a pitch PPGM1(2). In FIG. 1A, PPGM1(2)=4*L. In some embodiments, PPGM1(2) has a value other than 4*L.

Figure 3B:
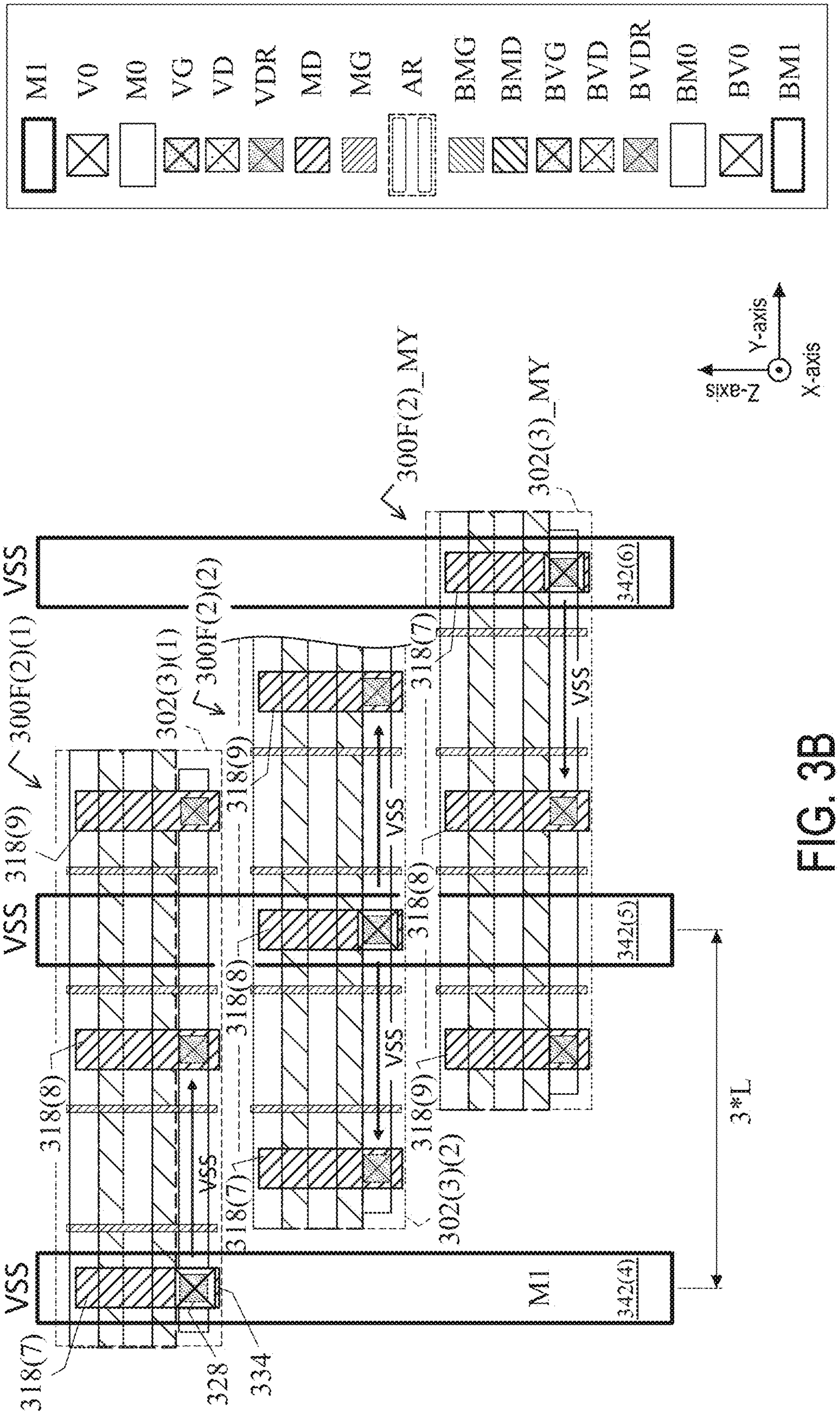

FIG. 3B is a layout diagram of front sides 300F(2)(1), 300F(2)(2) and 300F(2)_MY of corresponding cell regions 302(3)(1), 302(3)(2) and 302(3)_MY, in accordance with some embodiments.

Cell regions 302(3)(1), 302(3)(2) and 302(3)_MY of FIG. 3B are similar to, and are arranged similarly to, cell regions 302(1)(1), 302(2) and 302(1)(2) of FIG. 3A. For brevity, the discussion will focus on differences of FIG. 3B as compared to FIG. 3A rather than on similarities.

For simplicity of illustration, some but not all elements in FIG. 3B are called out with reference numbers. In FIG. 3B, elements in each of front sides which are called out with reference numbers include: MD contact structures 318(7)-318(9); an instance of VDR 328; an instance of V0 contact structure 334; (a portion of) an M1 PG rail 342(4); and (a portion) of an M1 PG rail 342(5). Elements in front side 300F(2)(2) which are called out with reference numbers include MD contact structures 318(7)-318(9); and (a portion) of M1 PG rail 342(5). Elements in front side 300F(2)_MY which are called out with reference numbers include: MD contact structures 318(7)-318(9); (a portion) of M1 PG rail 342(5); and (a portion of) an M1 PG rail 342(6).

Cell regions 302(3)(1) and 302(3)(2) are instances of a given cell region. Cell region 302(3)_MY is an instance of the given cell region albeit an instance that is mirror symmetric with respect to the Y-axis. As such, relative to the Y-axis, cell region 302(3)_MY is mirror symmetric with respect to each of cell regions 302(3)(1) and 302(3)(2).

Relative to the X-axis, M1 PG rails 342(4)-342(6) have a pitch PPGM1(3). In FIG. 3B, PPGM1(3)=3*L. In some embodiments, PPGM1(3) has a value other than 3*L.

In FIG. 3B: MD contact structures 318(8) and 318(9) are substantially free from being overlapped by M1 PG rail 342(5); M1 PG rail 342(5) substantially overlaps MD contact structure 318(8) of cell region (102(2)); MD contact structures 318(7), 318(8) and 318(9) of cell region 302(3)_MY and MD contact structures 318(7) and 318(9) of cell region 302(3)(2) are substantially free from being overlapped by M_2nd PG rail 342(5)); MD contact structures 318(7) and 318(9) of cell region 302(3)(2) and MD contact structures 318(7) and 318(8) of cell region 302(3)_MY are substantially free from being overlapped by M1 PG rail 342(6); and M1 PG rail 342(6) substantially overlaps MD contact structure 318(9) of cell region 302(3)_MY.

Figure 4:
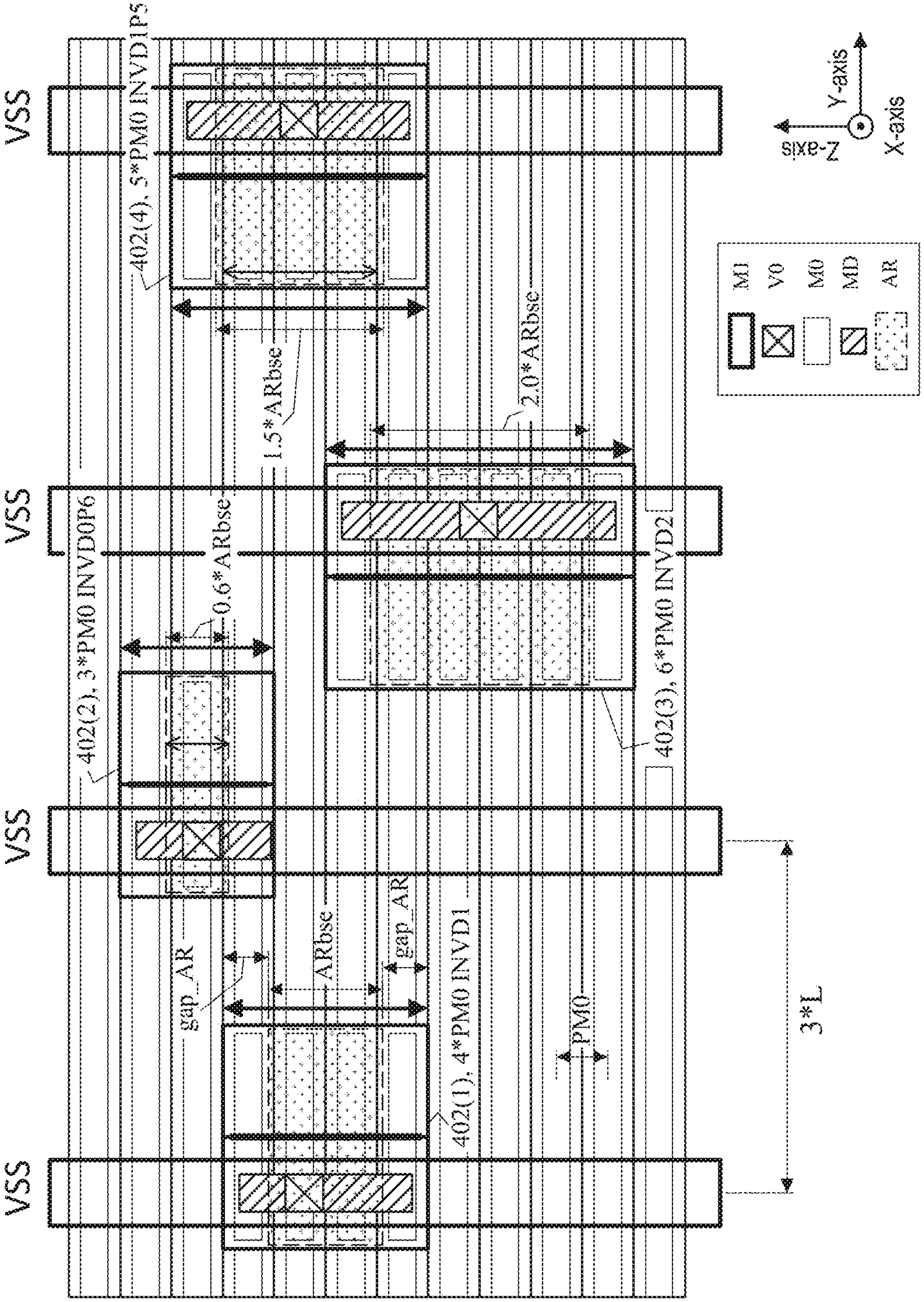

FIG. 4 is a layout diagram of corresponding cell regions 402(1)-402(4), in accordance with some embodiments.

In some embodiments, cell regions 402(1)-402(4) have a CFET architecture and thus have corresponding back sides (not shown for simplicity of illustration). The CFET architecture of cell regions 402(1)-402(4) includes the PG architecture which locates power rails in layers MET1 and BMET1 that advantageously facilitates scaling widths of the ARP and ARN of the corresponding CFET stacks, which improves design flexibility.

Cell region 402(1) is an inverter cell region of unit current-driving strength D1 (INVD1) which, relative to the Y-axis, has: a width (or height) of 4*PM0, where PM0 is a pitch of the M0 segments; and an AR width (or height) w_AR equal to a base AR width ARbse, i.e., w_AR=1.0*ARbse. Base AR width ARbse is a uniform width (height) for an AR in the corresponding semiconductor process technology node. A value for ARbse is determined by the design rules and scale of the corresponding semiconductor process technology node. In some embodiments, ARbse is a multiple of PM0.

Cell region 402(2) is an inverter cell region of current-driving strength D0P6 (INVD0P6), where D0P6=0.6*D1. Relative to the Y-axis, cell region 402(2) has: a width (or height) of 3*PM0; and an AR width (or height) of w_AR=0.6*ARbse.

Cell region 402(3) is an inverter cell region of current-driving strength D2 (INVD2), where D2=2.0*D1. Relative to the Y-axis, cell region 402(3) has: a width (or height) of 6*PM0; and an AR width (or height) of w_AR=2.0*ARbse.

Cell region 402(4) is an inverter cell region of current-driving strength D1P5 (INVD1P5), where D1P5=1.5*D1. Relative to the Y-axis, cell region 402(3) has: a width (or height) of 5*PM0; and an AR width (or height) of w_AR=1.5*ARbse.

Figure 5A:
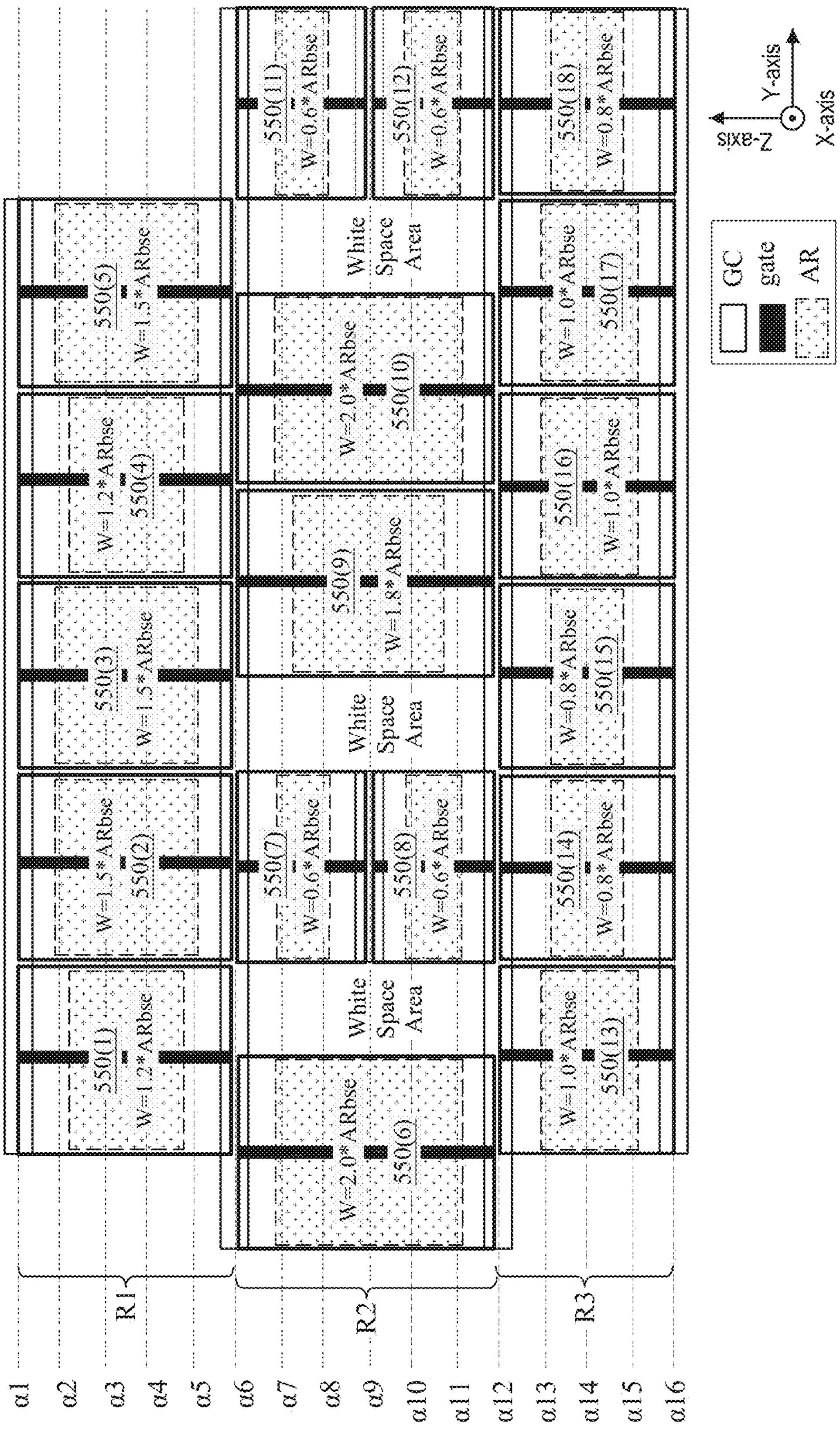

FIG. 5A is a layout diagram of corresponding cell regions, in accordance with some embodiments.

FIG. 5A includes rows R1-R3 that extend parallel to the X-axis. Relative to Y-axis: row R1 extends between alpha tracks al and $\alpha6$; row R2 extends between alpha tracks $\alpha6$ and $\alpha12$; and row R3 extends between alpha tracks $\alpha12$ and $\alpha16$.

In FIG. 5A, it is assumed that the pitch $P\alpha$ of the alpha tracks is the same as pitch PM0 of the M0 segments such that $P\alpha$=PM0. Relative to the Y-axis: a width (height) wR1 of row R1 is wR1=5*PM0; a width (height) wR2 of row R2 is wR2=6*PM0; and a width (height) wR3 of row R3 is wR3=4*PM0.

FIG. 5A includes cell regions 550(1)-550(18). Cell regions 550(1)-550(5) are in row R1. Cell regions 550(6)-550(12) are in row R2. Cell regions 550(13)-550(18) are in row R3.

In some embodiments, cell regions 550(1)-550(18) have a CFET architecture that includes the PG architecture which locates power rails in layers MET1 and BMET1 that advantageously facilitates scaling widths of the ARP and ARN of the corresponding CFET stacks, which improves design flexibility.

In row R1, each of cell regions 550(1)-550(5) has a width (height) of 5*PM0. In row R2, each of cell regions 550(6) and 550(9)-550(10) has a width (height) of 6*PM0. Cell regions 550(7) and 550(8) are 'half-height' cell regions that are stacked on each other relative to the Y-axis. Each of cell region 550(7) and 550(8) has a width (height) of 3*PM0. Cell regions 550(11) and 550(12) also are 'half-height' cell regions that are stacked on each other relative to the Y-axis. Each of cell region 550(11) and 550(12) has a width (height) of 3*PM0. In row R3, each of cell regions 550(13)-550(18) has a width (height) of 4*PM0.

In row R1: each of cell regions 550(1) and 550(4) has a current-driving strength of D1P2 and an AR width (or height) of w_AR=1.2*ARbse; and each of cell regions 550(2)-550(3) and 550(5) has a current-driving strength of D1P5 and an AR width (or height) of w_AR=1.5*ARbse.

In row R2: each of cell regions 550(6) and 550(10) has a current-driving strength of D2 and an AR width (or height) of w_AR=2.0*ARbse; each of cell regions 550(7)-550(8) and 550(11)-550(12) has a current-driving strength of D0P6 and an AR width (or height) of w_AR=0.6*ARbse; and cell region 550(9) has a current-driving strength of D1P8 and an AR width (or height) of w_AR=1.8*ARbse.

In row R3: each of cell regions 550(13) and 550(16)-550(17) has a current-driving strength of D1 and an AR width (or height) of w_AR=1.0*ARbse; and each of cell regions 550(14)-550(15) and 550(18) has a current-driving strength of D0P8 and an AR width (or height) of w_AR=0.8*ARbse.

In FIG. 5A, relative to the X-axis, there are 'white space areas,' i.e., gaps between adjacent cell regions. For example, there is a white space area between cell region 550(6) and each of cell regions 550(7) and 550(8). In some embodiments, relative to the X-axis, white space areas are added to a layout diagram because of one or more design rules of the corresponding semiconductor process technology node. For example, the white space area between cell region 550(6) and each of cell regions 550(7) and 550(8) is included in the layout diagram of FIG. 5A because of a design rule that precludes a cell region having a current-driving strength of D2 (e.g., cell region 550(6)) from abutting a cell region having a current-driving strength of D0P6 (e.g., each of cell regions 550(7) and 550(8).

Figure 5B:
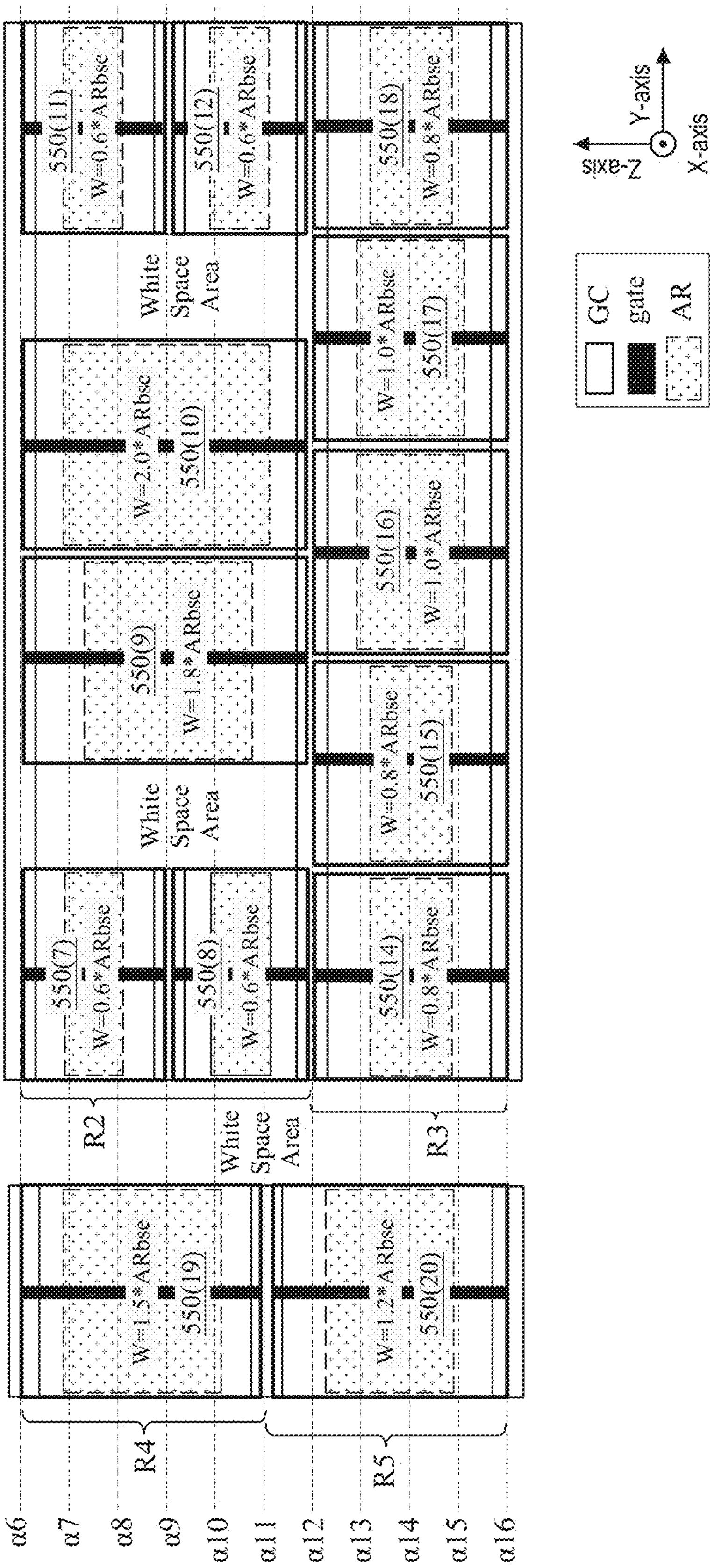

FIG. 5B is a layout diagram of corresponding cell regions, in accordance with some embodiments.

The cell regions of FIG. 5B are similar to the cell regions of FIG. 5A. For brevity, the discussion will focus on differences of FIG. 5B as compared to FIG. 5A rather than on similarities.

FIG. 5B includes a portion of rows R2 and R3 of FIG. 5A, i.e., includes cell regions 550(7)-550(12) or row R2 and cell regions 550(14)-550(18). FIG. 5B does not include row R1 of FIG. 5A.

Relative to the Y-axis, rows R2 and R4 extend between alpha tracks α6 and α16. FIG. 5B further includes rows R4 and R5 that extend between alpha tracks α6 and α16. However, whereas row R2 extends between alpha tracks α6 and α12, row R4 extends between alpha tracks α6 and α12. Also, whereas row R3 extends between alpha tracks α12 and α16, row R5 extends between alpha tracks all and α16.

Row R4 includes a cell region 550(19). Row R5 includes a cell region 550(20). Cell region 550(19) has a current-driving strength of D1P5 and an AR width (or height) of w_AR=1.5*ARbse. Cell region 550(20) has a current-driving strength of D1P2 and an AR width (or height) of w_AR=1.2*ARbse.

Figure 6:
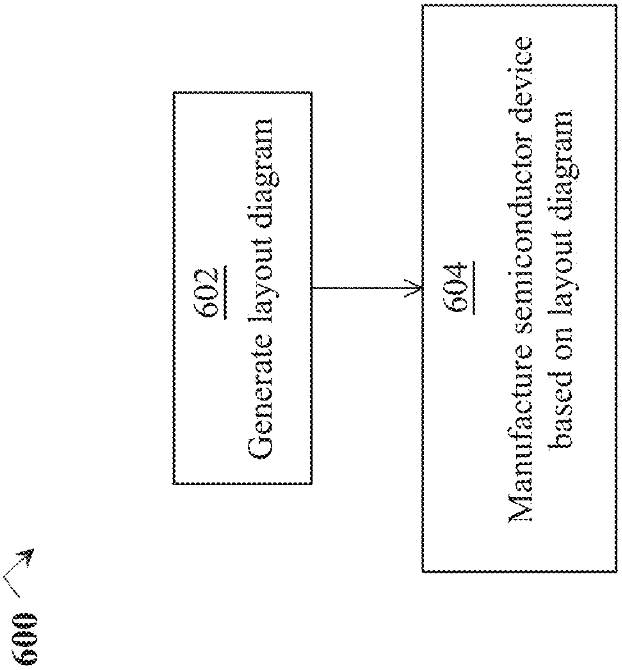
FIGS. 6 and 7A-7B are flowcharts of corresponding methods of manufacturing a memory device, in accordance with some embodiments.

FIG. 6 is a flowchart 600 of a method of manufacturing a memory device, in accordance with some embodiments.

The method of flowchart (flow diagram) 600 is implementable, for example, using EDA system 800 (FIG. 8, discussed below) and an IC manufacturing system 900 (FIG. 9, discussed below), in accordance with some embodiments. Examples of a semiconductor device which can be manufactured according to the method of flowchart 600 include semiconductor devices based on the layout diagrams disclosed herein, or the like.

In FIG. 6, the method of flowchart 600 includes blocks 602-604. At block 602, a layout diagram is generated which, among other things, includes one or more of layout diagrams disclosed herein, layout diagrams corresponding to one or more of the devices disclosed herein, or the like. Block 602 is implementable, for example, using EDA system 800 (FIG. 8, discussed below), in accordance with some embodiments. From block 602, flow proceeds to block 604.

At block 604, based on the layout diagram, at least one of (A) one or more photolithographic exposures are made or (b) one or more semiconductor masks are fabricated or (C) one or more components in a layer of a semiconductor device are fabricated. See discussion below of IC manufacturing system 900 in FIG. 9 below.

Figure 7A:
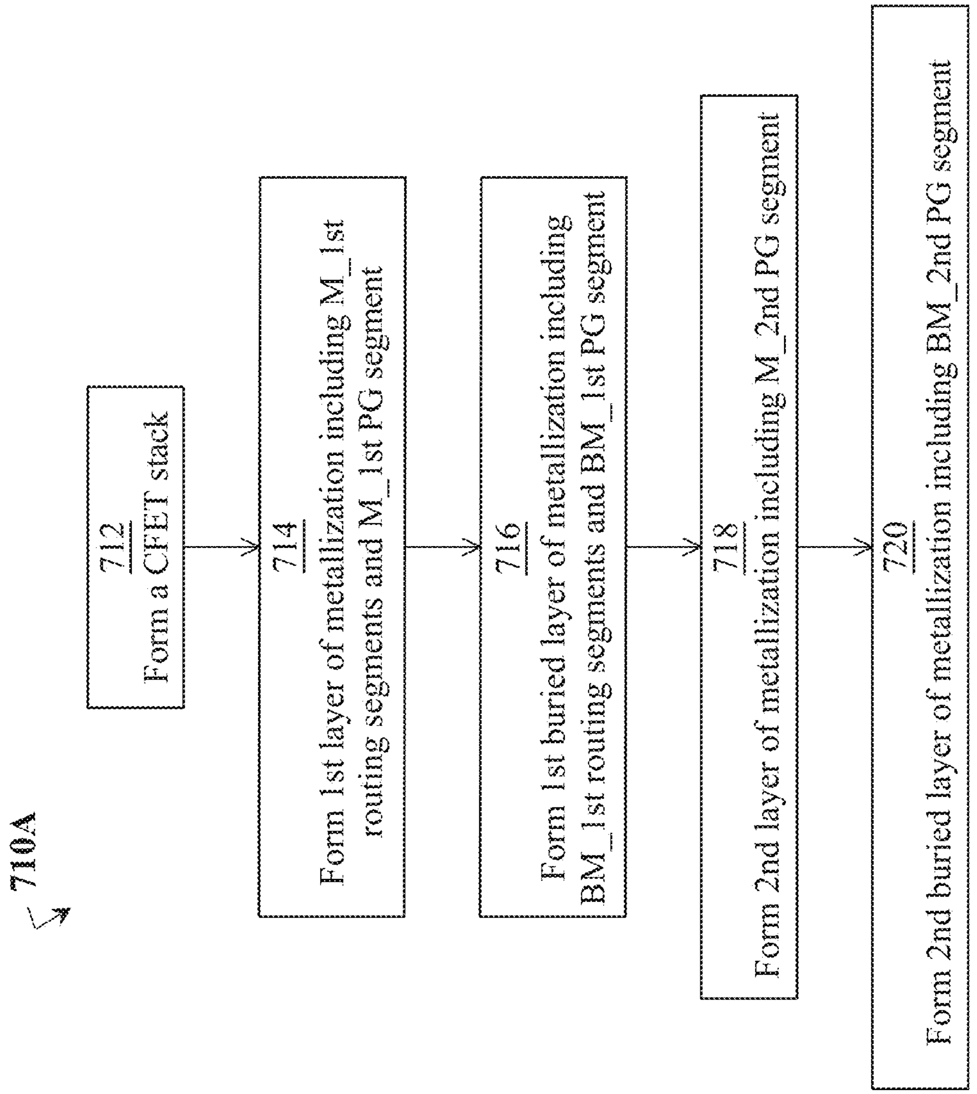

FIG. 7A is a flowchart 710A of a method of fabricating a semiconductor device, and more specifically an SRAM, in accordance with some embodiments.

Flowchart 710A is an example of block 604 of FIG. 6. Flowchart 710A includes blocks 712-720. Flowchart 710A shows the following sequence: block 712→block 714→block 716→block 718→block 720. In some embodiments, other sequences of blocks 712-720 are provided. Examples provided in the context of flowchart 710A assume first, second and third orthogonal directions that are, e.g., correspondingly parallel to the X-axis, Y-axis and Z-axis. The method of flowchart 710A is implementable, for example, using IC manufacturing system 900 (FIG. 9, discussed below), in accordance with some embodiments. Examples of a semiconductor device which can be manufactured according to the method of flowchart 710A include semiconductor devices having SRAMS based on the layout diagrams disclosed herein, or the like.

At block 712, a CFET stack is formed. Examples of the CFET stack include the CFET corresponding to cross-sections 208A of FIGS. 2A and 208B of FIG. 2C. From block 712, flow proceeds to block 714.

At block 714, a first layer of metallization is formed over the MD contact structure of CFET stack and that includes M_1st routing segments and an M_1st PG segment. Examples of the M_1st routing segments include M0 routing segments 138(1)-138(2) of FIG. 1A, or the like. An example of the M_1st PG segment is M0 PG segment 138(3) of FIG. 1A, or the like. From block 714, flow proceeds to block 716.

At block 716, a first buried layer of metallization is formed under the BMD contact structure of the CFET and that includes buried M_1st (BM_1st) routing segments and a BM_1st PG segment. Examples of the BM_1st routing segments include BM0 routing segments 140(1)-140(2) of FIG. 1B, or the like. An example of the BM_1st PG segment is BM0 PG segment 140(3) of FIG. 1B, or the like. From block 716, flow proceeds to block 718.

At block 718, a second layer of metallization is formed over the first layer of metallization and that includes an M_2nd PG rail. An example of the M_2nd PG rail is M1 PG rail 142(1) of FIG. 1A, or the like. From block 718, flow proceeds to block 720.

At block 720, a second buried layer of metallization is formed under the first buried layer of metallization and that includes a BM_2nd PG rail. An example of the BM_2nd PG rail is BM1 PG rail 144(1) of FIG. 1B, or the like.

Figure 7B:
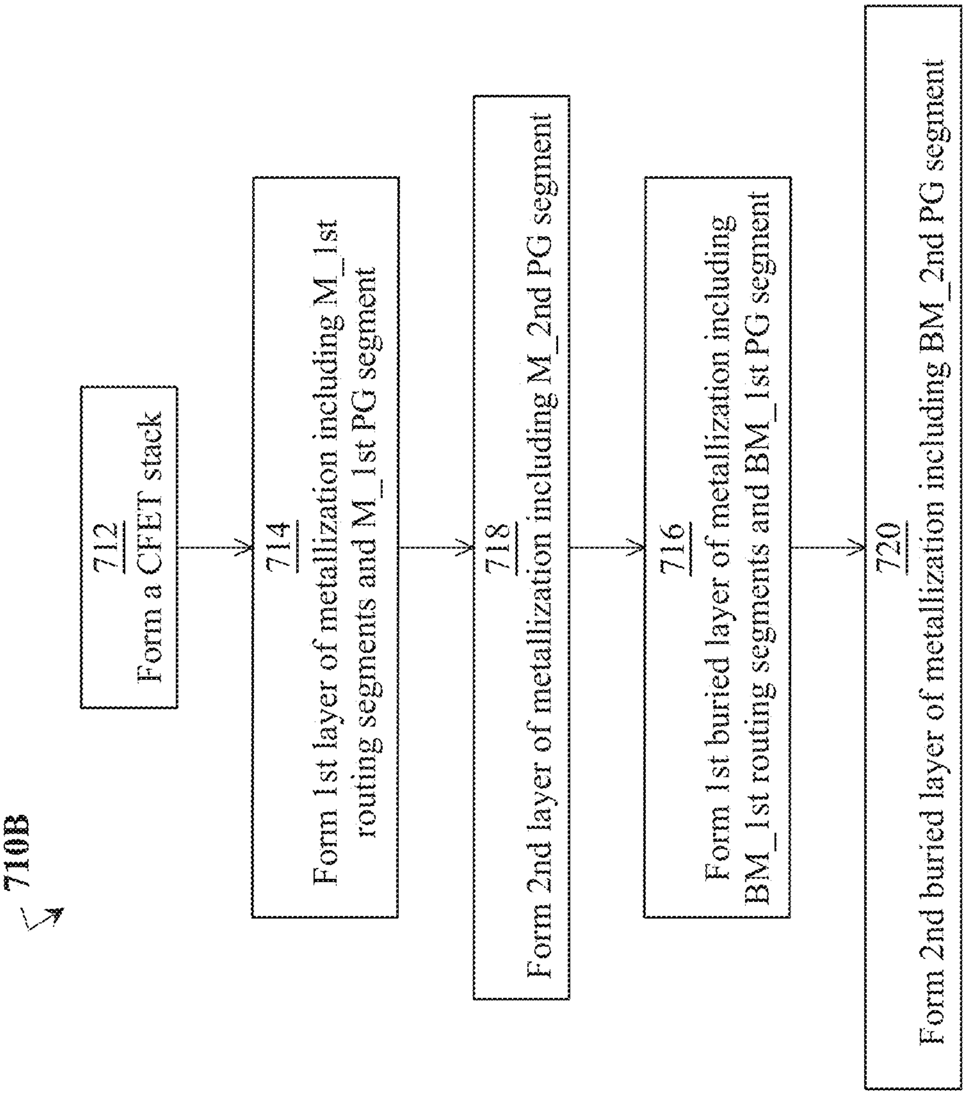

FIG. 7B is a flowchart 710B of a method of fabricating a semiconductor device, and more specifically an SRAM, in accordance with some embodiments.

Flowchart 710B is similar to flowchart 710A of FIG. 7A in that, e.g., flowchart 710B includes the same blocks as flowchart 710, namely blocks 712-720. Flowchart 710B differs from flowchart 710A in that flowchart 710B shows a different sequence of flow through blocks 712-720 as compared to the sequence shown in flowchart 710A.

In FIG. 7B, flowchart 710B shows the following sequence: block 712→block 714→block 718→block 716→block 720. In some embodiments, the sequence of flowchart 710B is described as forming front side layers before back side layers.

Figure 8:
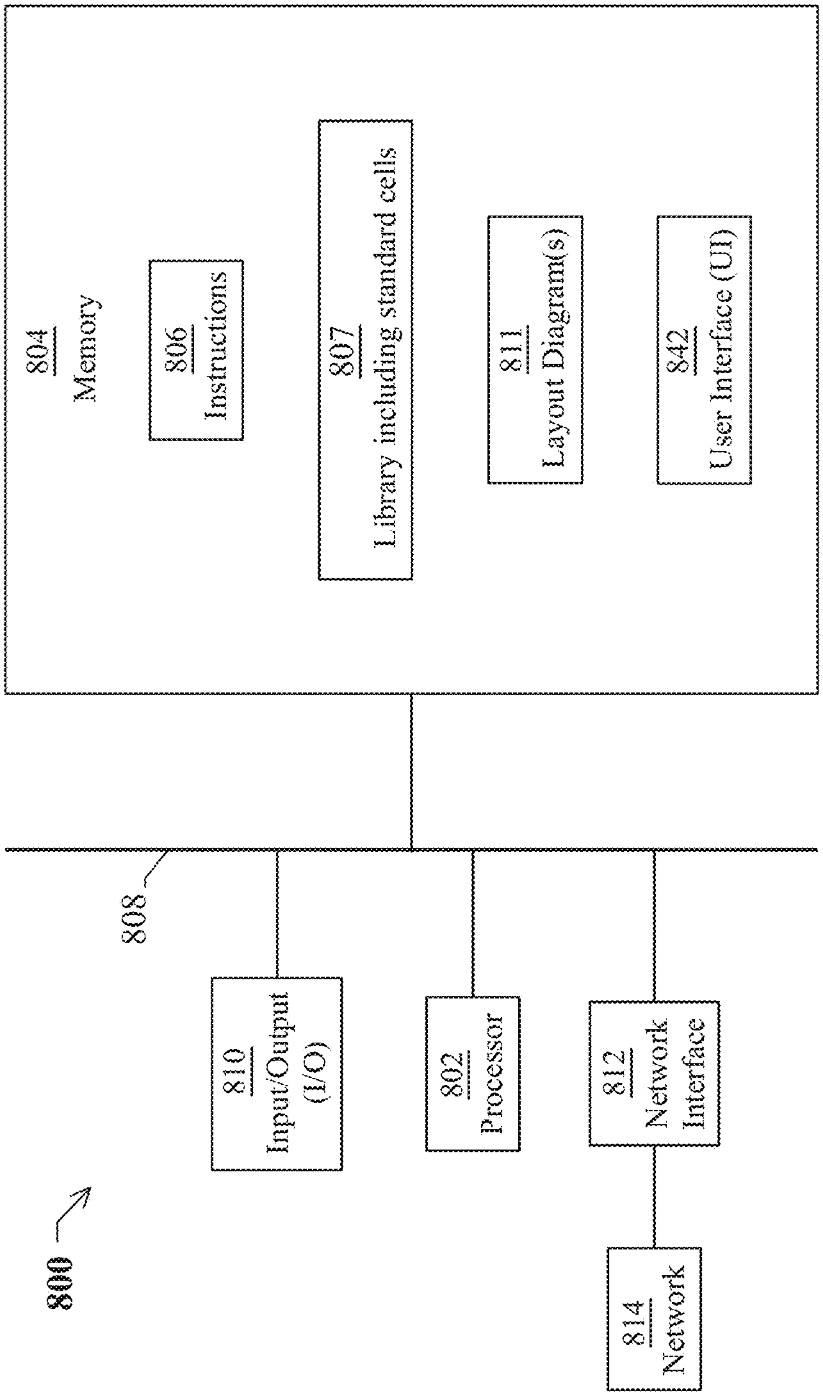
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an automatic placement and routing (APR) system. In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of, e.g., methods such as the methods disclosed herein of generating layout diagrams, methods of generating layout diagrams such as the layout diagrams disclosed herein or layout diagrams corresponding to the devices disclosed herein, or the like, in accordance with one or more embodiments (hereinafter, the noted processes and/or methods).

Storage medium 804, amongst other things, stores layout diagrams 811 such as the layout diagrams disclosed herein, other the like.

Processor 802 is electrically coupled to computer-readable storage medium 804 via a bus 808. Processor 802 is further electrically coupled to an I/O interface 810 by a bus 808. A network interface 812 is further electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted processes and/or methods. In one or more embodiments, storage medium 804 further stores information which facilitates performing a portion or all of the noted processes and/or methods. In one or more embodiments, storage medium 804 stores library 807 of standard cells including such standard cells as disclosed herein. In some embodiments, storage medium 804 stores one or more layout diagrams 811.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 further includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) through I/O interface 810. The information is stored in computer-readable medium 804 as UI 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
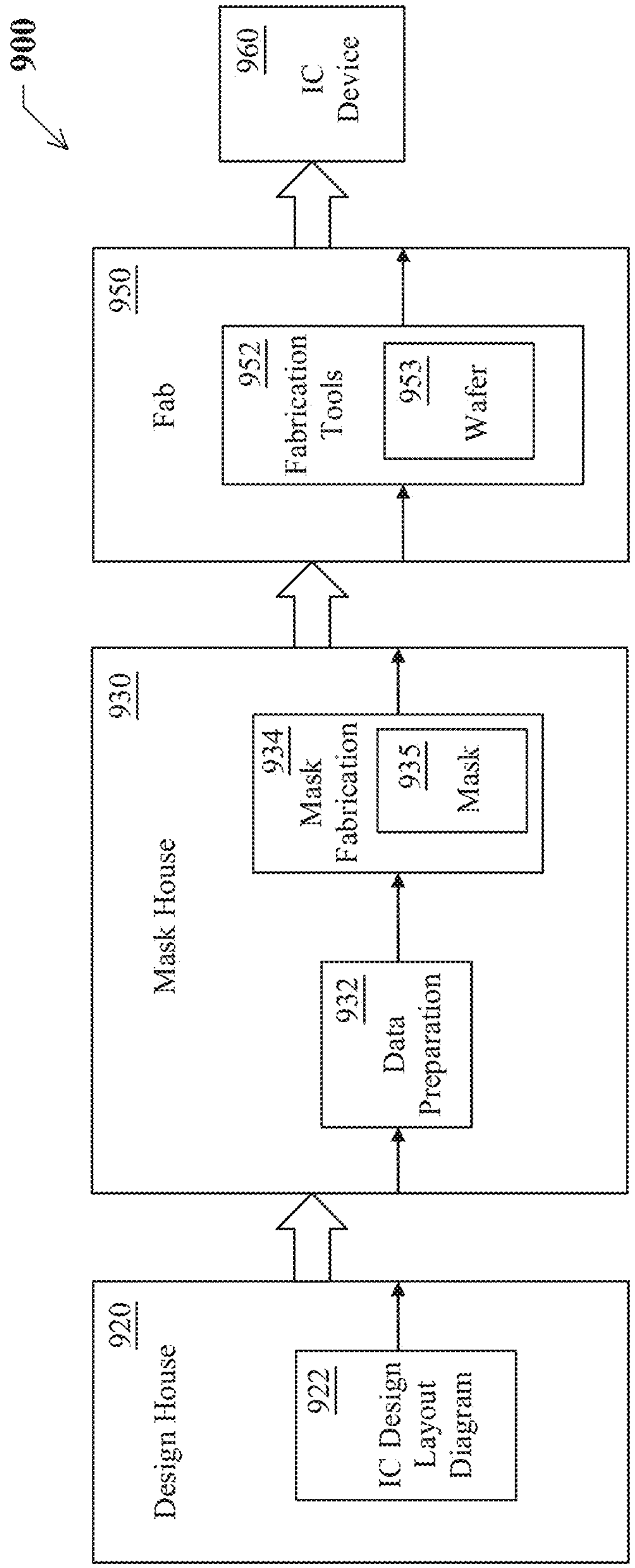
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments.

In some embodiments, based on the layout diagram generated by block 602 of FIG. 6, the IC manufacturing system 900 implements block 604 of FIG. 6 wherein at least one of (A) one or more semiconductor masks or (B) at least one component in a layer of an inchoate semiconductor integrated circuit is fabricated using manufacturing system 900. In some embodiments, the IC manufacturing system 900 implements the flowcharts of FIGS. 7A-7B.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate terminal, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 920 implements a proper design procedure to form IC design layout 922. The design procedure includes one or more of logic design, physical design or place and route. IC design layout 922 is presented in one or more data files having information of the geometrical patterns. For example, IC design layout 922 is expressed in a GDSII file format or DFII file format.

Mask house 930 includes data preparation 932 and mask fabrication 934. Mask house 930 uses IC design layout 922 to manufacture one or more masks 935 to be used for fabricating the various layers of IC device 960 according to IC design layout 922. Mask house 930 performs mask data preparation 932, where IC design layout 922 is translated into a representative data file ("RDF"). Mask data preparation 932 supplies the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 950. In FIG. 9, mask data preparation 932, mask fabrication 934, and mask 935 are illustrated as separate elements. In some embodiments, mask data preparation 932 and mask fabrication 934 are collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution adjust features, phase-shifting masks, other suitable techniques, and the like or combinations thereof. In some embodiments, inverse lithography technology (ILT) is further used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout 922 to fabricate a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 922.

The above description of mask data preparation 932 has been simplified for the purposes of clarity. In some embodiments, mask data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 935 or a group of masks 935 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 950 is an IC fabrication business that includes one or more manufacturing facilities for the fabrication of a variety of different IC products. In some embodiments, IC fab 950 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 950 uses mask (or masks) 935 fabricated by mask house 930 to fabricate IC device 960 using fabrication tools 952. Thus, IC fab 950 at least indirectly uses IC design layout 922 to fabricate IC device 960. In some embodiments, a semiconductor wafer 953 is fabricated by IC fab 950 using mask (or masks) 935 to form IC device 960. Semiconductor wafer 953 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a device includes: an active region extending in a first direction; a first metal-to-S/D (MD) contact structure extending in a second direction perpendicular to the first direction, and over and coupled to the active region; a first layer of metallization over the first MD contact structure and having segments (M_1st segments) extending in the first direction and each having a substantially same width relative to the second direction, the M_1st segments including M_1st routing segments configured for routing signals, and an M_1st power grid (PG) segment having a portion over and coupled to the first MD contact structure; a second layer of metallization over the first layer of metallization and having segments (M_2nd segments) that extend in the second direction and include an M_2nd PG rail configured for a first reference voltage, a portion thereof being over and coupled to the M_1st PG segment; and the M_2nd PG rail extending across multiple cell regions.

In some embodiments, the device further includes: a via-to-MD (VD) contact structure between the active region and the first MD contact structure; and a via-to-M_1st (VIA_1st) contact structure between the M_1st PG segment and the M_2nd PG rail.

In some embodiments, relative to the first direction, the VIA_1st contact structure is substantially aligned to the first MD contact structure.

In some embodiments, relative to the first direction, the M_2nd PG rail is substantially aligned to the first MD contact structure.

In some embodiments, relative to the second direction, the VIA_1st contact structure is substantially aligned to the VD contact structure.

In some embodiments, relative to the second direction, the M_1st PG segment is substantially free from overlapping the active region.

In some embodiments, relative to the second direction, the M_1st PG segment is substantially overlapped by the active region.

In some embodiments, at least one of the M_1st routing segments is substantially overlapped by the active region.

In some embodiments, the M_1st PG segment is an intra-cell PG segment that does not extend outside a corresponding cell region.

In some embodiments, the device further includes: a cell region which includes the active region, the first MD contact structure and a portion of the M_2nd PG rail; and a second M_2nd PG rail configured for the first reference voltage, a portion thereof being over and coupled to the M_1st PG segment; and wherein, relative to the first direction, the cell region has a width, w_cell, and the first and second M_2nd PG rails are separated by a pitch p_PGM2nd; and a ratio, p_PGM2nd/w_cell, of the pitch p_PGM2nd to the width w_cell is in a range as follows, $(\approx(3/5))\leq(p\_PGM2nd/w\_cell)\leq(\approx(4/5))$.

In some embodiments, the device further includes: a cell region which includes the active region and the first MD contact structure; second and third MD contact structures extending in the second direction, and over and correspondingly coupled to second and third portions of the active region; and a second M_2nd PG rail configured for the first reference voltage, a portion thereof being over the M_1st PG segment; and wherein: the second and third MD contact structures are also included in the cell region; and relative to the first direction, the cell region is free from having another MD contact structure between a first side boundary of the cell region and the first MD contact structure, and the second MD contact structure is between the first and third MD contact structures.

In some embodiments, the cell region is a first instance thereof (first cell region); the device further comprises a second cell region and a second instance of the first cell region (third cell region); and portions of the second M_2nd PG rail being correspondingly over the M_1st PG segment of each of the second and third cell regions; relative to the second direction, the first cell region is stacked on the second cell region, and the second cell region is stacked on the second cell region; the first, second and third cell regions are displaced from each other relative to the first direction; the second MD contact structure of the first cell region is substantially free from being overlapped by the second M_2nd PG rail; the second M_2nd PG rail substantially overlaps the third MD contact structure of the first cell region and the second MD contact structure of the third cell region; and the first, second and third MD contact structures of the second cell region and the first and third MD contact structures of the third cell region are substantially free from being overlapped by the second M_2nd PG rail.

In some embodiments, the cell region is a first instance thereof (first cell region); the device further comprises second and third instances of the first cell region (second and third cell regions); portions of the second M_2nd PG rail being correspondingly over the M_1st PG segment of each of the second and third cell regions; relative to the second direction, the first cell region is stacked on the second cell region, and the second cell region is stacked on the second cell region; the first, second and third cell regions are displaced from each other relative to the first direction; the second and third MD contact structures of the first cell region are substantially free from being overlapped by the second M_2nd PG rail; the second M_2nd PG rail substantially overlaps the second MD contact structure of the second cell region; and the first, second and third MD contact structures of the third cell region and the first and third MD contact structures of the second cell region are substantially free from being overlapped by the second M_2nd PG rail.

In some embodiments, the device further includes: a third M_2nd PG rail configured for the first reference voltage, a portion thereof being over the M_1st PG segment of the third cell region; and wherein: the first and third MD contact structures of the second cell region and the first and second MD contact structures of the third cell region are substantially free from being overlapped by the third M_2nd PG rail; and the third M_2nd PG rail substantially overlaps the third MD contact structure of the third cell region.

In some embodiments, a device includes: first and second active regions extending in a first direction, being arranged in a stack relative to a second direction perpendicular to the first direction, and having corresponding and different first and second dopant types; a first metal-to-S/D (MD) contact structure extending in a third direction perpendicular to each of the first and second directions, and over and coupled to the first active region; a first buried MD (BMD) contact structure extending in the third direction, and under and coupled to the second active region; a first layer of metallization over the first MD contact structure and having segments (M_1st segments) extending in the first direction and each having a substantially same width relative to the third direction, the M_1st segments including: M_1st routing segments configured for routing signals; and an M_1st power grid (PG) segment having a portion over and coupled to the first MD contact structure; a first buried layer of metallization under the first BMD contact structure and having buried segments (BM_1st segments) extending in the first direction and each having a substantially same width relative to the third direction, the BM_1st segments including: BM_1st routing segments configured for routing signals; and a BM_1st PG segment having a portion under and coupled to the first BMD contact structure; a second layer of metallization over the first layer of metallization and having segments (M_2nd segments) that extend in the second direction and include an M_2nd PG rail configured for a first reference voltage, a portion thereof being over and coupled to the M_1st PG segment; a second buried layer of metallization under the first buried layer of metallization and having segments (BM_2nd segments) that extend in the second direction and include a BM_2nd PG rail configured for a second reference voltage, a portion thereof being under and coupled to the BM_1st PG segment; and each of the M_2nd PG rail and the BM_2nd PG rail extending correspondingly across multiple cell regions.

In some embodiments, the M_2nd PG rail and the BM_2nd PG rail are substantially aligned relative to the first direction.

In some embodiments, the device further includes: a via-to-MD (VD) contact structure between the first active region and the first MD contact structure; a buried VD contact structure between the second active region and the first BMD contact structure; a via-to-M_1st (VIA_1st) contact structure between the M_1st PG segment and the M_2nd PG rail; a buried VIA_1st (BVIA_1st) contact structure between the BM_1st PG segment and the BM_2nd PG rail; and relative to the first direction, the VIA_1st contact structure is substantially aligned to the first MD contact structure, and the BVIA_1st contact structure is substantially aligned to the first BMD contact structure.

In some embodiments, relative to the first direction, the M_2nd PG rail is substantially aligned to the first MD contact structure, and the BM_2nd PG rail is substantially aligned to the first buried MD contact structure.

In some embodiments, relative to the second direction, the M_1st PG segment is substantially free from overlapping the first active region, or the BM_1st PG segment is substantially free from overlapping the second active region.

In some embodiments, relative to the second direction, the M_1st PG segment is substantially overlapped by the first active region, or the BM_1st PG segment is substantially overlapped by the second active region.

In some embodiments, at least one of the M_1st routing segments is substantially overlapped by the first active region, or at least one of the BM_1st routing segments is substantially overlapped by the second active region.

In some embodiments, each of the M_1st PG segment and the BM_1st PG segment is an intra-cell PG segment that does not extend outside a corresponding cell region.

In some embodiments, a method (of forming a device having a complimentary field-effect transistor (CFET) architecture) includes: forming a CFET stack including: a first metal-to-S/D (MD) contact structure extending in a third direction perpendicular to each of the first and second directions, and over and coupled to the first active region; a first buried MD (BMD) contact structure extending in the third direction, and under and coupled to the second active region; forming a first layer of metallization over the first MD contact structure and having segments (M_1st segments) extending in the first direction and each having a substantially same width relative to the third direction, the M_1st segments including: M_1st routing segments configured for routing signals; and an M_1st power grid (PG) segment having a portion over and coupled to the first MD contact structure; forming a first buried layer of metallization under the first BMD contact structure and having buried segments (BM_1st segments) extending in the first direction and each having a substantially same width relative to the third direction, the BM_1st segments including: BM_1st routing segments configured for routing signals; and a BM_1st PG segment having a portion under and coupled to the first BMD contact structure; forming a second layer of metallization over the first layer of metallization and having segments (M_2nd segments) that extend in the second direction and include a M_2nd PG rail extending across multiple cell regions and being configured for a first reference voltage, a portion thereof being over and coupled to the M_1st PG segment; forming a second buried layer of metallization under the first buried layer of metallization and having segments (BM_2nd segments) that extend in the second direction and include a BM_2nd PG rail extending across multiple cell regions and being configured for a second reference voltage, a portion thereof being under and coupled to the BM_1st PG segment.

In some embodiments, the forming a second layer of metallization includes, relative to the first direction, aligning the M_2nd PG rail to a first reference track line extending parallel to the first direction; and the forming a second buried layer of metallization includes, relative to the first direction, aligning the BM_2nd PG rail to the first reference track line.

In some embodiments, the forming a second layer of metallization includes. relative to the first direction, aligning the M_2nd PG rail to the first MD contact structure, and the forming a second buried layer of metallization includes, relative to the first direction, aligning the BM_2nd PG rail to the first buried MD contact structure.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A device comprising:

an active region extending in a first direction;

a first metal-to-S/D (MD) contact structure extending in a second direction perpendicular to the first direction, and over and coupled to the active region;

a first layer of metallization over the first MD contact structure and having segments (M_1st segments) extending in the first direction and each having a substantially same width relative to the second direction, the M_1st segments including:

M_1st routing segments configured for routing signals; and an M_1st power grid (PG) segment having a portion over and coupled to the first MD contact structure;

a second layer of metallization over the first layer of metallization and having segments (M_2nd segments) that extend in the second direction and include an M_2nd PG rail configured for a first reference voltage, a portion thereof being over and coupled to the M_1st PG segment; and the M_2nd PG rail extending across multiple cell regions, and wherein the M_1st PG segment is an intra-cell PG segment that does not extend outside a corresponding cell region.

2. The device of claim 1, further comprising:

a via-to-MD (VD) contact structure between the active region and the first MD contact structure; and a via-to-M_1st (VIA_1st) contact structure between the M_1st PG segment and the M_2nd PG rail.

3. The device of claim 2, wherein:
relative to the first direction, the VIA_1st contact structure is substantially aligned to the first MD contact structure.
4. The device of claim 1, wherein:
relative to the first direction, the M_2nd PG rail is substantially aligned to the first MD contact structure.
5. The device of claim 1, wherein:
relative to the second direction, the M_1st PG segment is substantially free from overlapping the active region.
6. The device of claim 1, wherein:
relative to the second direction, the M_1st PG segment is substantially overlapped by the active region.
7. The device of claim 1, further comprising:
a cell region which includes the active region and the first MD contact structure;
second and third MD contact structures extending in the second direction, and over and correspondingly coupled to second and third portions of the active region; and
a second M_2nd PG rail configured for the first reference voltage, a portion thereof being over the M_1st PG segment; and
wherein:
the second and third MD contact structures are also included in the cell region; and relative to the first direction,
the cell region is free from having another MD contact structure between a first side boundary of the cell region and the first MD contact structure, and
the second MD contact structure is between the first and third MD contact structures.
8. The device of claim 7, wherein:
the cell region is a first instance thereof (first cell region);
the device further comprises a second cell region and a second instance of the first cell region (third cell region); and
portions of the second M_2nd PG rail being correspondingly over the M_1st PG segment of each of the second and third cell regions;
relative to the second direction,
the first cell region is stacked on the second cell region, and
the second cell region is stacked on the third cell region;
the first, second and third cell regions are displaced from each other relative to the first direction;
the second MD contact structure of the first cell region is substantially free from being overlapped by the second M_2nd PG rail;
the second M_2nd PG rail substantially overlaps the third MD contact structure of the first cell region and the second MD contact structure of the third cell region; and
the first, second and third MD contact structures of the second cell region and the first and third MD contact structures of the third cell region are substantially free from being overlapped by the second M_2nd PG rail.
9. The device of claim 7, wherein:
the cell region is a first instance thereof (first cell region);
the device further comprises second and third instances of the first cell region (second and third cell regions);
portions of the second M_2nd PG rail being correspondingly over the M_1st PG segment of each of the second and third cell regions;
relative to the second direction,
the first cell region is stacked on the second cell region, and
the second cell region is stacked on the third cell region;
the first, second and third cell regions are displaced from each other relative to the first direction;
the second and third MD contact structures of the first cell region are substantially free from being overlapped by the second M_2nd PG rail;
the second M_2nd PG rail substantially overlaps the second MD contact structure of the second cell region; and
the first, second and third MD contact structures of the third cell region and the first and third MD contact structures of the second cell region are substantially free from being overlapped by the second M_2nd PG rail.
10. The device of claim 1, further comprising:
a cell region which includes the active region and the first MD contact structure;
second and third MD contact structures extending in the second direction, and over and correspondingly coupled to second and third portions of the active region;
a second M_1st PG segment collinear and separated from the M_1st PG segment, a portion thereof over and coupled to the third MD contact structure; and
a second M_2nd PG rail configured for the first reference voltage, a portion thereof being over the second M_1st PG segment;
wherein:
the second and third MD contact structures are also included in the cell region; and relative to the first direction:
the cell region is free from having another MD contact structure between a first side boundary of the cell region and the first MD contact structure; and
the second MD contact structure is between the first and third MD contact structures.
11. A device comprising:
first and second active regions extending in a first direction, being arranged in a stack relative to a second direction perpendicular to the first direction, and having corresponding and different first and second dopant types;
a first metal-to-S/D (MD) contact structure extending in a third direction perpendicular to each of the first and second directions, and over and coupled to the first active region;
a first buried MD (BMD) contact structure extending in the third direction, and under and coupled to the second active region;
a first layer of metallization over the first MD contact structure and having segments (M_1st segments) extending in the first direction and each having a substantially same width relative to the third direction, the M_1st segments including:
M_1st routing segments configured for routing signals; and
an M_1st power grid (PG) segment having a portion over and coupled to the first MD contact structure;
a first buried layer of metallization under the first BMD contact structure and having buried segments (BM_1st segments) extending in the first direction and each having a substantially same width relative to the third direction, the BM_1st segments including:

BM_1st routing segments configured for routing signals; and a BM_1st PG segment having a portion under and coupled to the first BMD contact structure;

a second layer of metallization over the first layer of metallization and having segments (M_2nd segments) that extend in the second direction and include an M_2nd PG rail configured for a first reference voltage, a portion thereof being over and coupled to the M_1st PG segment;

a second buried layer of metallization under the first buried layer of metallization and having segments (BM_2nd segments) that extend in the second direction and include a BM_2nd PG rail configured for a second reference voltage, a portion thereof being under and coupled to the BM_1st PG segment; and each of the M_2nd PG rail and the BM_2nd PG rail extending correspondingly across multiple cell regions.

12. The device of claim 11, wherein:

the M_2nd PG rail and the BM_2nd PG rail are substantially aligned relative to the first direction.

13. The device of claim 11, further comprising:

a via-to-MD (VD) contact structure between the first active region and the first MD contact structure;

a buried VD contact structure between the second active region and the first BMD contact structure;

a via-to-M_1st (VIA_1st) contact structure between the M_1st PG segment and the M_2nd PG rail;

a buried VIA_1st (BVIA_1st) contact structure between the BM_1st PG segment and the BM_2nd PG rail; and relative to the first direction, the VIA_1st contact structure is substantially aligned to the first MD contact structure, and the BVIA_1st contact structure is substantially aligned to the first BMD contact structure.

14. The device of claim 11, wherein:

relative to the first direction, the M_2nd PG rail is substantially aligned to the first MD contact structure, and the BM_2nd PG rail is substantially aligned to the first buried MD contact structure.

15. The device of claim 11, wherein:

relative to the second direction, the M_1st PG segment is substantially free from overlapping the first active region, or the BM_1st PG segment is substantially free from overlapping the second active region.

16. The device of claim 11, wherein:

relative to the second direction, the M_1st PG segment is substantially overlapped by the first active region, or the BM_1st PG segment is substantially overlapped by the second active region.

17. The device of claim 11, wherein:

each of the M_1st PG segment and the BM_1st PG segment is an intra-cell PG segment that does not extend outside a corresponding cell region.

18. A method of forming a device having a complimentary field-effect transistor (CFET) architecture, the method comprising:

forming a CFET stack including:

a first metal-to-S/D (MD) contact structure extending in a third direction perpendicular to each of first and second directions, and over and coupled to a first active region; and a first buried MD (BMD) contact structure extending in the third direction, and under and coupled to a second active region;

forming a first layer of metallization over the first MD contact structure and having segments (M_1st segments) extending in the first direction and each having a substantially same width relative to the third direction, the M_1st segments including:

M_1st routing segments configured for routing signals; and an M_1st power grid (PG) segment having a portion over and coupled to the first MD contact structure;

forming a first buried layer of metallization under the first BMD contact structure and having buried segments (BM_1st segments) extending in the first direction and each having a substantially same width relative to the third direction, the BM_1st segments including:

BM_1st routing segments configured for routing signals; and a BM_1st PG segment having a portion under and coupled to the first BMD contact structure;

forming a second layer of metallization over the first layer of metallization and having segments (M_2nd segments) that extend in the second direction and include a M_2nd PG rail extending across multiple cell regions and being configured for a first reference voltage, a portion thereof being over and coupled to the M_1st PG segment; and forming a second buried layer of metallization under the first buried layer of metallization and having segments (BM_2nd segments) that extend in the second direction and include a BM_2nd PG rail extending across multiple cell regions and being configured for a second reference voltage, a portion thereof being under and coupled to the BM_1st PG segment.

19. The method of claim 18, wherein:

the forming the second layer of metallization includes:

relative to the first direction, aligning the M_2nd PG rail to a first reference track line extending parallel to the first direction; and the forming the second buried layer of metallization includes:

relative to the first direction, aligning the BM_2nd PG rail to the first reference track line.

20. The method of claim 18, wherein:

the forming the second layer of metallization includes:

relative to the first direction, aligning the M_2nd PG rail to the first MD contact structure, and the forming the second buried layer of metallization includes:

relative to the first direction, aligning the BM_2nd PG rail to the first buried MD contact structure.

* * * * *